(12) United States Patent
Park et al.

(10) Patent No.: US 8,804,448 B2
(45) Date of Patent: Aug. 12, 2014

(54) METHOD OF SELECTING ANTI-FUSES AND METHOD OF MONITORING ANTI-FUSES

(75) Inventors: Ju-Seop Park, Seongnam-si (KR); Jong-Pil Son, Seongnam-si (KR); Sin-Ho Kim, Suwon-si (KR); Hyoung-Joo Kim, Seongnam-si (KR); Je-Min Ryu, Seoul (KR); Sung-Min Seo, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 266 days.

(21) Appl. No.: 13/461,987

(22) Filed: May 2, 2012

(65) Prior Publication Data

US 2013/0286759 A1  Oct. 31, 2013

(30) Foreign Application Priority Data

Apr. 26, 2012  (KR) .................... 10-2012-0043781

(51) Int. Cl.
*G11C 7/00* (2006.01)

(52) U.S. Cl.
USPC ................ 365/225.7; 365/189.16; 365/201

(58) Field of Classification Search
USPC ........ 365/225.7, 189.14, 189.16, 189.12, 201
See application file for complete search history.

(56) References Cited

U.S. PATENT DOCUMENTS

| 6,240,033 | B1 | 5/2001 | Yang et al. |
| 6,366,118 | B2 | 4/2002 | Oh et al. |
| 6,967,878 | B2 * | 11/2005 | Dono ............................ 365/200 |
| 7,336,537 | B2 * | 2/2008 | Louie et al. .............. 365/185.09 |
| 7,952,950 | B2 * | 5/2011 | Miyatake et al. .......... 365/225.7 |
| 2009/0285033 | A1 | 11/2009 | Yamada |

FOREIGN PATENT DOCUMENTS

| JP | 2009-277294 | 11/2009 |
| KR | 0328447 | 2/2002 |
| KR | 0654126 | 11/2006 |

* cited by examiner

*Primary Examiner* — Son Dinh
(74) *Attorney, Agent, or Firm* — Muir Patent Consulting, PLLC

(57) ABSTRACT

For selecting anti-fuses in a semiconductor memory device, a decoder block may be enabled to receive selection information for selecting the anti-fuses. The selection information is decoded in the decoder block to select at least one of the anti-fuses. Target operation is performed on the selected anti-fuses. The decoder block is disabled.

15 Claims, 18 Drawing Sheets

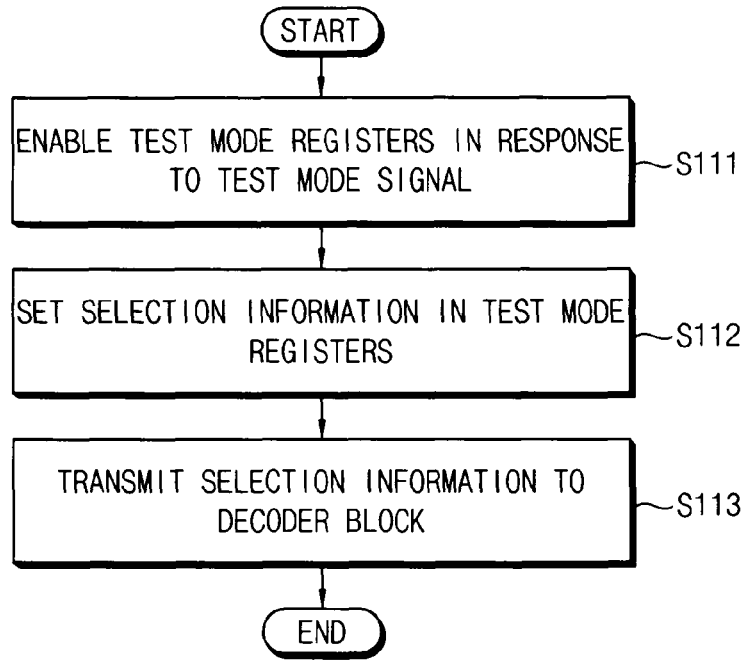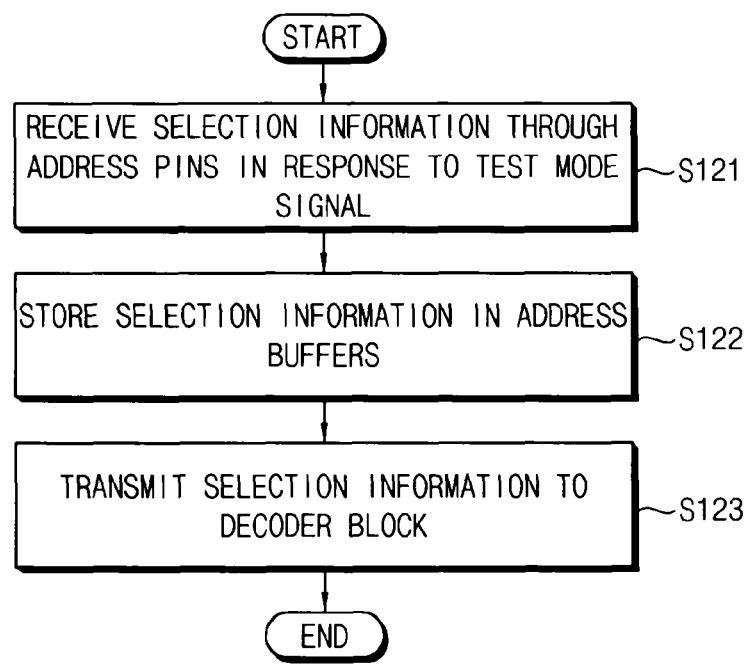

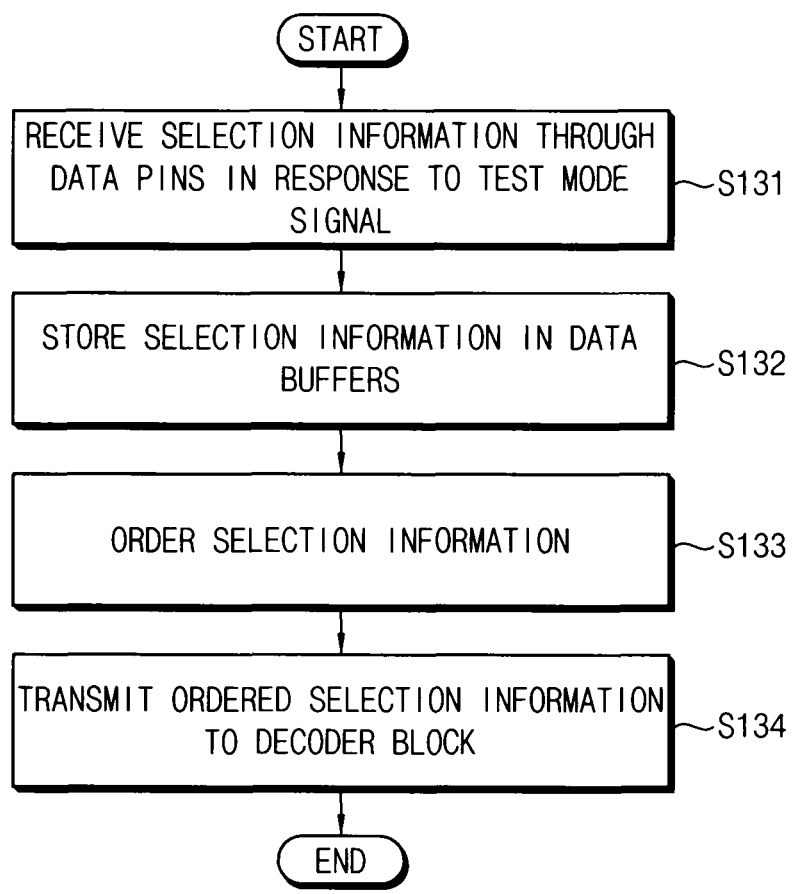

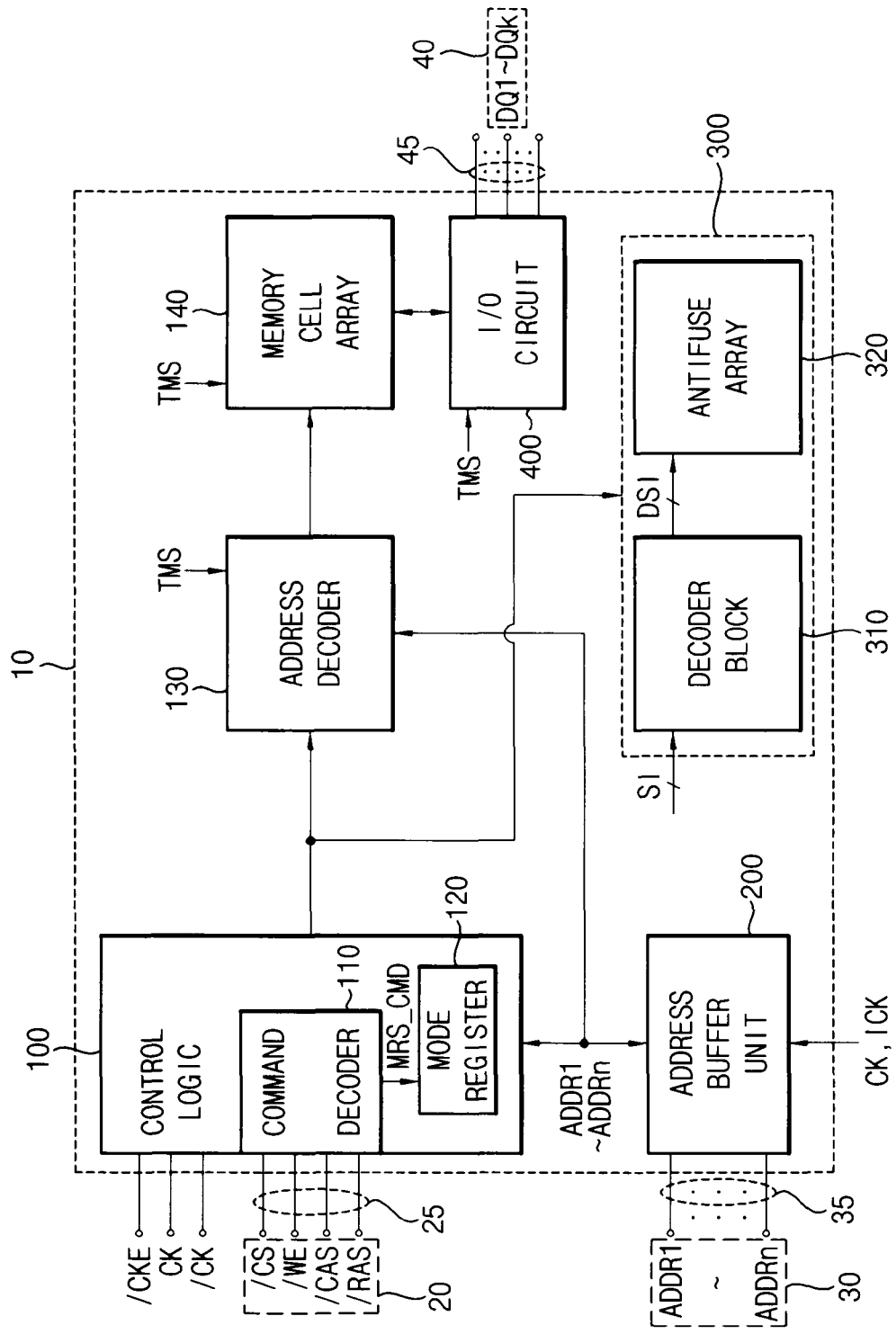

METHOD OF SELECTING ANTI-FUSES AND METHOD OF MONITORING ANTI-FUSES

CROSS-REFERENCE TO RELATED APPLICATION(S)

This US non-provisional application claims benefit of priority under 35 USC §119 to Korean Patent Application No. 10-2012-0043781 filed on Apr. 26, 2012 in the Korean Intellectual Property Office (KIPO), the contents of which application are herein incorporated by reference in its entirety.

BACKGROUND

Example embodiments relate to electrical fusing, and more particularly a method of selecting anti-fuses and a method of monitoring anti-fuses.

SUMMARY

Some example embodiments provide a method of selecting anti-fuses, capable of reducing the time required for testing or programming.

Some example embodiments provide a method of selecting anti-fuses, capable of increasing yield.

In some example embodiments, for selecting anti-fuses in a semiconductor memory device, a decoder block is enabled to receive selection information for selecting the anti-fuses. The selection information may be decoded in the decoder block to select at least one of the anti-fuses. Target operations may be performed on the selected anti-fuses. The decoder block may be disabled.

In some embodiments, the selection information may be received using a plurality of test mode registers in the semiconductor memory device in a test mode and a command path related to normal operation of the semiconductor memory device may be disabled in the test mode.

For receiving the selection information, the test mode registers may be enabled in response to a test mode signal. The selection information may be set in the test mode registers based on address signal. The selection information may be transmitted to the decoder block.

In some embodiments, the selection information may be received using a plurality of address pins in the semiconductor memory device in a test mode and an address path related to normal operation of the semiconductor memory device may be disabled in the test mode.

For receiving the selection information, the selection information may be received through the address pins in response to a test mode signal. The selection information may be stored in a plurality of address buffers, each connected to each of the address pins. The selection information may be transmitted to the decoder block.

In some embodiments, the selection information may be received using a plurality of data pins in the semiconductor memory device in a test mode and a data path related to normal operation of the semiconductor memory device may be disabled in the test mode.

For receiving the selection information, the selection information may be received through the data pins in response to a test mode signal. The selection information may be stored in a plurality of data buffers, each connected to each of the data pins. The selection information may be ordered in an ordering unit connected to the data buffers. The ordered selection information may be transmitted to the decoder block.

The target operation may correspond to a test operation or a program operation on the selected anti-fuses.

In some example embodiments, for monitoring anti-fuses in a semiconductor memory device, test voltage is applied to an anti-pad connected to a first terminal of at least one anti-fuse and the test voltage has a level lower than a level of a program voltage. A second terminal of the at least one anti-fuse is connected to a ground voltage. Current from the at least one anti-fuse is measured in the anti-pad. State of the at least one anti-fuse is monitored based on the measured current.

In some embodiments, the anti-fuses may be arranged in a non-array structure.

In some embodiments, the anti-fuses may be arranged in an array structure.

In some example embodiments, for monitoring anti-fuses in a semiconductor memory device, test voltage is applied to an anti-pad connected to a first terminal of at least one anti-fuse and the test voltage has a level lower than a level of a program voltage. A second terminal of the at least one anti-fuse is connected to a ground voltage. Current from the at least one anti-fuse is measured in a current measuring circuit using a resistor and the current measuring circuit is connected to the anti-fuse in parallel with the anti-pad. State of the at least one anti-fuse is monitored based on the measured current.

In some embodiments, the at least one anti-fuse may be monitored at a package level of the semiconductor memory device.

In some embodiments, the resistor may be connected to an address pin or a data mask pin of the semiconductor memory device.

Accordingly, the time required for testing or programming the anti-fuses may be reduced and the yield may be increased.

BRIEF DESCRIPTION OF THE DRAWINGS

The above and other aspects and features of the disclosure will become apparent by describing in detail exemplary embodiments thereof with reference to the attached drawings, in which:

FIG. 2 is a flow chart illustrating the step (S100) in FIG. 1 according to some example embodiments.

FIG. 3 is a flow chart illustrating the step (S100) in FIG. 1 according to other example embodiments.

FIG. 4 is a flow chart illustrating the step (S100) in FIG. 1 according to other example embodiments.

FIG. 5 is a block diagram illustrating a semiconductor memory device capable of performing the method of selecting anti-fuses according to some example embodiments.

DETAILED DESCRIPTION OF THE EMBODIMENTS

Figure 1:
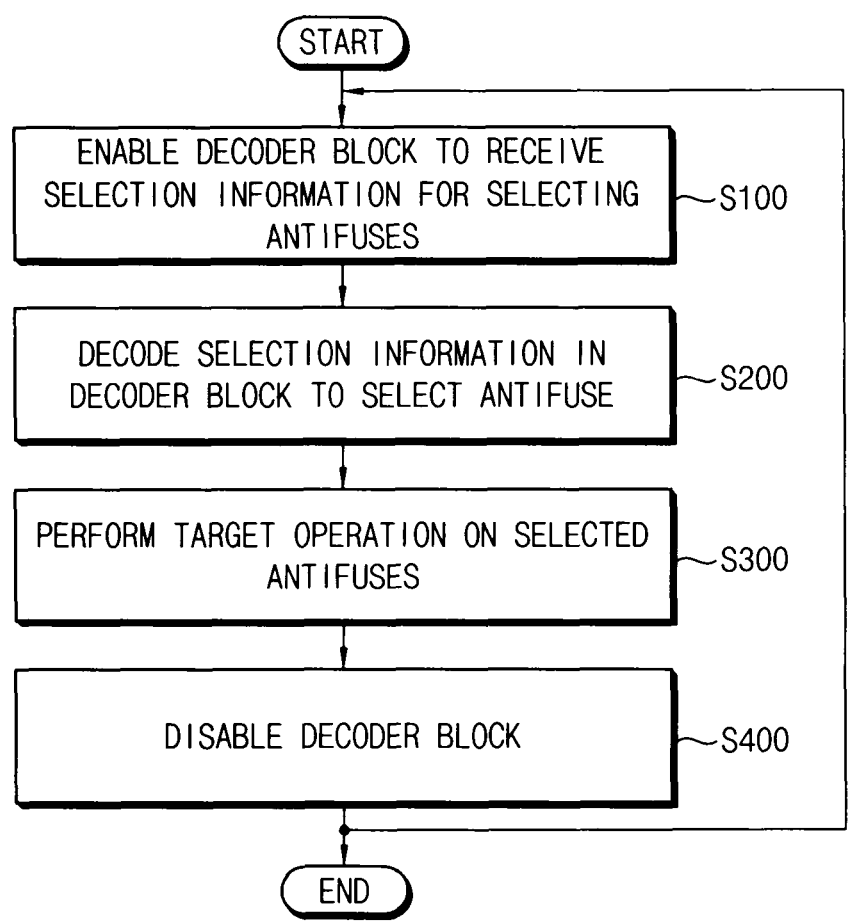
FIG. 1 is a flow chart illustrating a method of selecting anti-fuses according to some example embodiments.

Various example embodiments will be described more fully hereinafter with reference to the accompanying drawings, in which some example embodiments are shown. The present invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity. Like numerals refer to like elements throughout.

It will be understood that, although the terms first, second, third etc. may be used herein to describe various elements, components, regions, layers, and/or sections, these elements, components, regions, layers, and/or sections should not be limited by these terms. Unless otherwise indicated, these terms are only used to distinguish one element, component, region, layer or section from another element, component, region, layer or section. Thus, a first element, component, region, layer, or section discussed below could be termed a second element, component, region, layer, or section, and similarly, a second element, component, region, layer, or section could be termed a first element, component, region layer, or section without departing from the teachings of the disclosure. As used herein, the term "and/or" includes any and all combinations of one or more of the associated listed items.

It will be understood that when an element is referred to as being "on," "connected," or "coupled" to another element or layer, it can be directly on, connected, or coupled to the other element or layer or intervening elements or layers may be present. In contrast, when an element or layer is referred to as being "directly on," "directly connected," or "directly coupled" to another element or layer, there are no intervening elements or layers present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" should not exclude the plural forms as well, unless the context clearly indicates otherwise. It will be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application and will not be interpreted in an idealized or overly formal sense unless expressly so defined herein.

A fuse circuit is capable of providing an output signal having different logic levels according to states of programmed fuses, and the fuse circuit may be employed in various devices. For example, semiconductor memory devices include redundant memory cells against defective memory cells in the semiconductor memory devices. The defective memory cells are replaced with the redundant memory cells based on fuse information. When an address of the defective memory cell is inputted, a normal path is cut off and a redundancy path to the redundant cell is activated according to a programmed/unprogrammed state of the fuse. The fuse circuit may be used for these types of repair operations.

The fuse circuit may include a laser fuse, electrical fuse or anti-fuse.

FIG. 1 is a flow chart illustrating a method of selecting anti-fuses according to some example embodiments.

Referring to FIG. 1, a decoder block is enabled and selection information is received for selecting at least one anti-fuse of a plurality of anti-fuses in order to perform a program operation or a test operation on the selected anti-fuses (S100). For example, when n-bit information is used for selecting the least one anti-fuse, the selection information may include n bits, where n may be a natural number greater than one. In some embodiments, the selection information is decoded in the decoder block and at least one anti-fuse is selected of the plurality of anti-fuses (S200). For example, the decoder block may decode the n-bit selection information to provide $2^n$-bit decoded selection information to an anti-fuse array including the plurality of anti-fuses, and anti-fuses of the plurality of anti-fuses may be selected based on the $2^n$-bit decoded selection information. A target operation is performed on the selected anti-fuses (S300). For example, a program operation or a test operation is performed on the selected anti-fuses based on the $2^n$-bit decoded selection information. After the target operation is performed on the selected anti-fuses, the decoder block is disabled (S400). Steps S100~S400 may be repeated until the target operation is performed on all of target anti-fuses.

FIG. 2 is a flow chart illustrating the step (S100) in FIG. 1 according to some example embodiments.

FIG. 2 illustrates that the anti-fuses are selected using a plurality of test mode registers in some embodiments.

Referring to FIG. 2, for receiving the selection information (S100a), the plurality of test mode registers are enabled in response to a test mode signal (S111). The plurality of test mode registers may be included in a mode register of a semiconductor memory device. The test mode registers may be enabled during an activation period of the test mode signal, and the test mode registers may be initialized (reset) when the test mode ends. In addition, when the test mode signal is activated, a command path associated with a normal operation of a semiconductor memory device including the test mode registers may be disabled. The selection information for selecting actifuses is set in the test mode registers (S112). The selection information is transmitted to the decoder block (S113).

FIG. 3 is a flow chart illustrating the step (S100) in FIG. 1 according to other example embodiments.

FIG. 3 illustrates that the anti-fuses are selected using a plurality of address pins in some embodiments.

Referring to FIG. 3, for receiving the selection information (S100b), the selection information is received through the plurality of address pins in response to a test mode signal (S121). In addition, when the test mode signal is activated, an address path associated with normal operation of a semiconductor memory device including the address pins may be disabled. The selection information is stored in each of a plurality of address buffers, each connected to each of the address pins (S122). The selection is transmitted to the decoder block in the address buffers (S123).

FIG. 4 is a flow chart illustrating the step (S100) in FIG. 1 according to other example embodiments.

FIG. 4 illustrates that the anti-fuses are selected using a plurality of data pins in some embodiments.

Referring to FIG. 4, for receiving the selection information (S100c), the selection information is received through the plurality of data pins in response to a test mode signal (S131). In addition, in some embodiments, when the test mode signal is activated, a data path associated with normal operation of a semiconductor memory device including the address pins may be disabled. The selection information is stored in each of a plurality of data buffers, each connected to each of the data pins (S132). The selection information may be stored in each of the data buffers in burst mode. For example, when the selection information is stored in each of the data buffers with a burst length of m, the selection information may be received through k data pins, where m is a natural number less than n, and k is a natural number less than n. The received selection information with m burst length is ordered into n-bit selection information in an ordering unit connected to the k data buffers (S133). The m-bit selection information is stored in each of k data buffers, and k*m-bits selection information is ordered into the n-bit selection information. The ordered n-bit selection information is transmitted to the decoder block in the address buffers (S134). The term "pin" broadly refers to an electrical interconnection for an integrated circuit (e.g., a pad or other electrical contact on the integrated circuit).

FIG. 5 is a block diagram illustrating a semiconductor memory device capable of performing the method of selecting anti-fuses according to some example embodiments.

Referring to FIG. 5, a semiconductor memory device 10 includes a control logic 100, an address buffer unit 200, an address decoder 130, a memory cell array 140, an input/output (I/O) circuit 400 and an anti-fuse circuit 300.

The control logic 100 receives control signals 20 through command pins 25, receives an address signal 30 through address pins 35 and controls the address decoder 130 which accesses the memory cell array 130 and the anti-fuse circuit 300 based on commands and the address signal. The control signals 20 include /CE, /WE, /CAS and /RAS. The address signal 30 includes ADDR1~ADDRn. The combination of the control signals /CE, /WE, /CAS and /RAS designate the command. In addition, in some embodiments, the control logic 100 may also receive a clock enable signal /CKE, a clock signal CK and an inverted clock signal /CK.

The address buffer unit 200 receives the address signal 30 through the address pins 35, and provides the address signal ADDR1~ADDRn to the control logic 100 and the address decoder 130 in synchronization with the clock signal CK or the inverted clock signal /CK.

The I/O circuit 400 provides data 40 to the memory cell array 140, or receives the data 40 from the memory cell array 140 through the data pins 45. The data 40 includes DQ1~DQk.

The control logic 100 includes a command decoder 110 and a mode register 120. The command decoder 110 decodes the command designated by the control signals /CE, /WE, /CAS and /RAS to provide a mode register set (MRS) command MRS_CMD to the mode register 120. The mode register 120 sets an operation mode of the semiconductor memory device 10 in response to the MRS command MRS_CMD. The operation mode of the semiconductor memory device 10 may include a test mode, MRS mode, TMRS mode and a normal operation mode.

The anti-fuse circuit 300 may include a decoder block 310 and an anti-fuse array 320 including a plurality of anti-fuse cells, with each cell having an anti-fuse. The decoder block 310 is enabled in the test mode, and decodes the selection information SI with a plurality of bits to provide decoded selection information DSI to the anti-fuse array 320. The decoded selection information DSI may correspond to wordline selection signal for selection wordlines connected to the anti-fuse cells.

The semiconductor memory device 10 of FIG. 5 receives the selection information SI with a plurality of bits using test mode registers, the address pins 35 or the data pins 45, decodes the selection information SI to provide decoded selection information DSI to the anti-fuse array 320, selects desired anti-fuses in the anti-fuse array 320, and tests or programs the selected anti-fuses. Therefore, a time required for testing or programming the anti-fuses may be reduced, and circuit area may be saved by using the address pins 35 or the data pins 45.

When the test mode signal TMS is activated and the test mode signal TMS is applied to the address decoder 130, the memory cell array 140 and the I/O circuit 400, command path, address path and data path related to normal operation of the semiconductor memory device 10 may be disabled. For example, when the test mode signal TMS is activated, the address decoder 130 is disabled and the address decoder 130 dose not receive the command from the control logic 100 or the address signal ADDR1~ADDRn from the address buffer unit 200. In addition, in some embodiments, when the test mode signal TMS is activated, the I/O circuit 400 provides signals from the data pins 45 to the decoder block 310 and not to the memory cell array 140.

Figure 6:
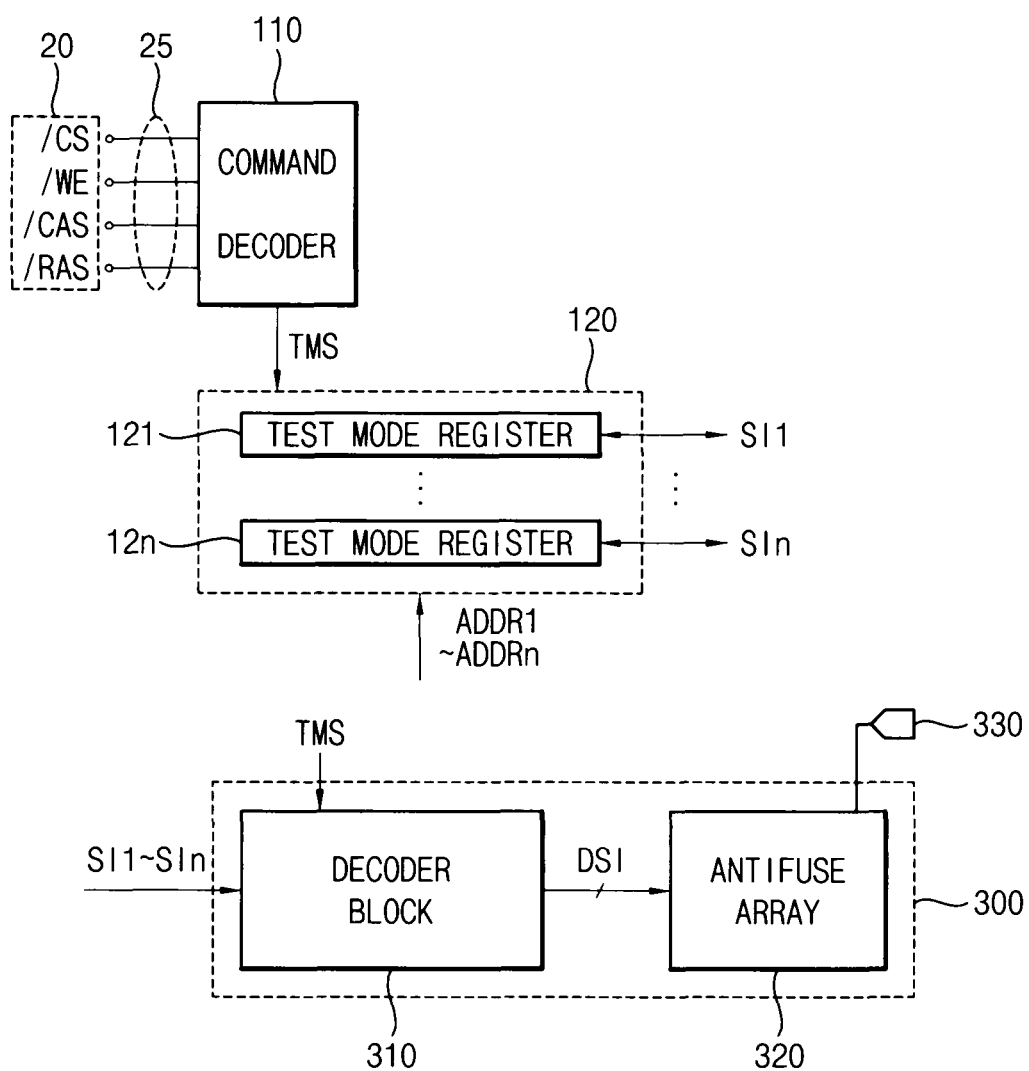
FIG. 6 illustrates that the anti-fuses are selected in the semiconductor memory device of FIG. 5 according to some example embodiments.

FIG. 6 illustrates that the anti-fuses are selected in the semiconductor memory device 10 of FIG. 5 according to some example embodiments.

Referring to FIG. 6, the mode register 120 includes a plurality of test mode registers 121~12n. The command decoder 110 decodes the command designated by the control signals /CE, /WE, /CAS and /RAS to activate a test mode signal TMS. Each of the test mode registers 121~12n is enabled in response to the test mode signal TMS, and each of the selection information SI1~SIn is set in each of the test mode registers 121~12n in response to the address signal ADDR1~ADDRn. The selection information SI1~SIn is transmitted to the decoder block 310. The decoder block 310 is enabled in response to the test mode signal TMS and decodes the selection information SI1~SIn to provide the decoded selection information DSI to the anti-fuse array 320 for selecting desired anti-fuses. The program operation or the test operation is performed on the selected anti-fuses under control of the control logic 100.

Figure 7:
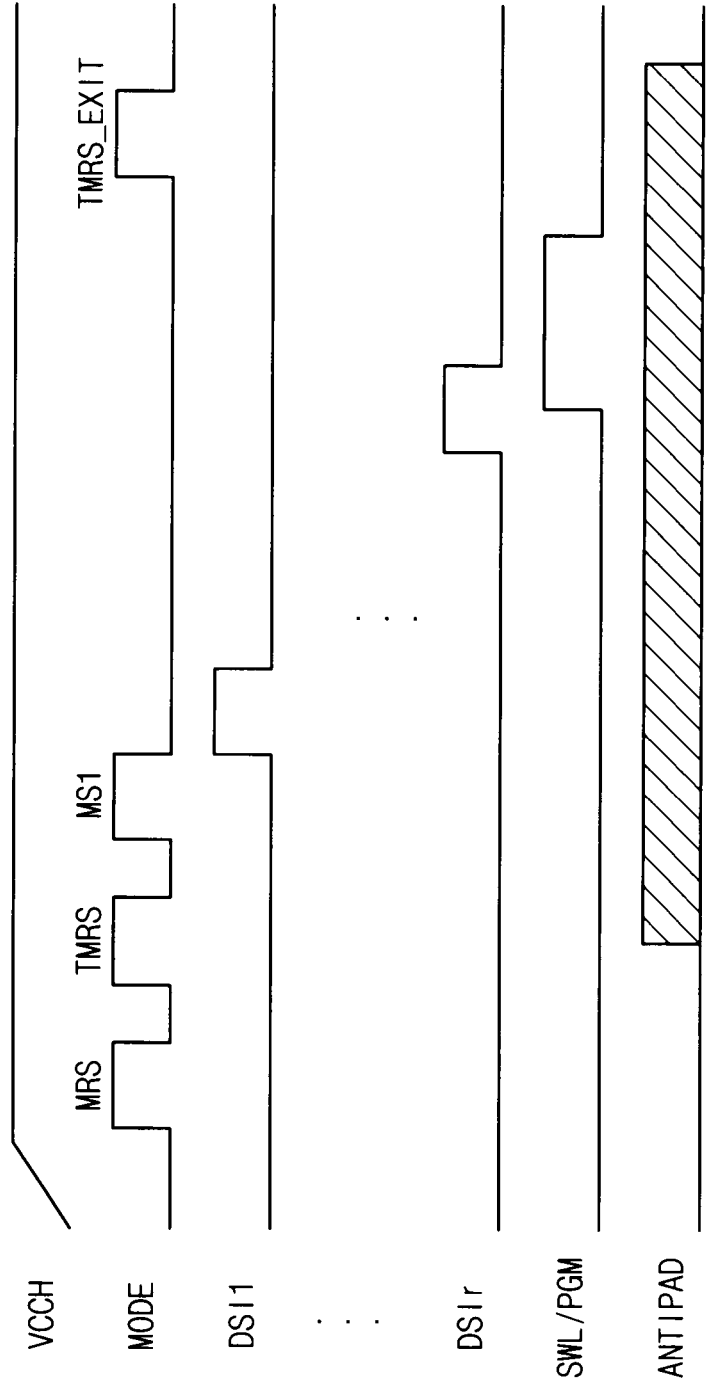
FIG. 7 is a timing diagram illustrating operation of the semiconductor memory device of FIG. 6.

FIG. 7 is an exemplary timing diagram illustrating operation of the semiconductor memory device of FIG. 6.

Referring to FIG. 7, after a power supply voltage VCCH is stabilized, the operation mode of the semiconductor device sequentially enters the MRS mode MRS, TMRS mode TMRS and a first operation mode MS1. The first operation mode MS1 designates an operation mode in which the anti-fuses are selected using the test mode registers 121~12n. In an embodiment in which the semiconductor memory device 10 enters the first operation mode MS1, the anti-fuses are selected in the anti-fuse array 320 based on the decoded selection information DSI1~DSIr as described with reference to FIG. 6. When the anti-fuses are selected in the anti-fuse array 320, the selected anti-fuses may be programmed in response to a wordline selection signal SWL and a program signal PGM. When the programming of the selected anti-fuses is completed, the operation mode exits from the TMRS mode (e.g. TMRS_EXIT). A high voltage with about 5.5V is applied to an anti-pad 330 which is commonly connected to the anti-fuses during entrance into the TMRS mode TMRS and exit from the TMRS mode TMRS_EXIT.

Figure 8:
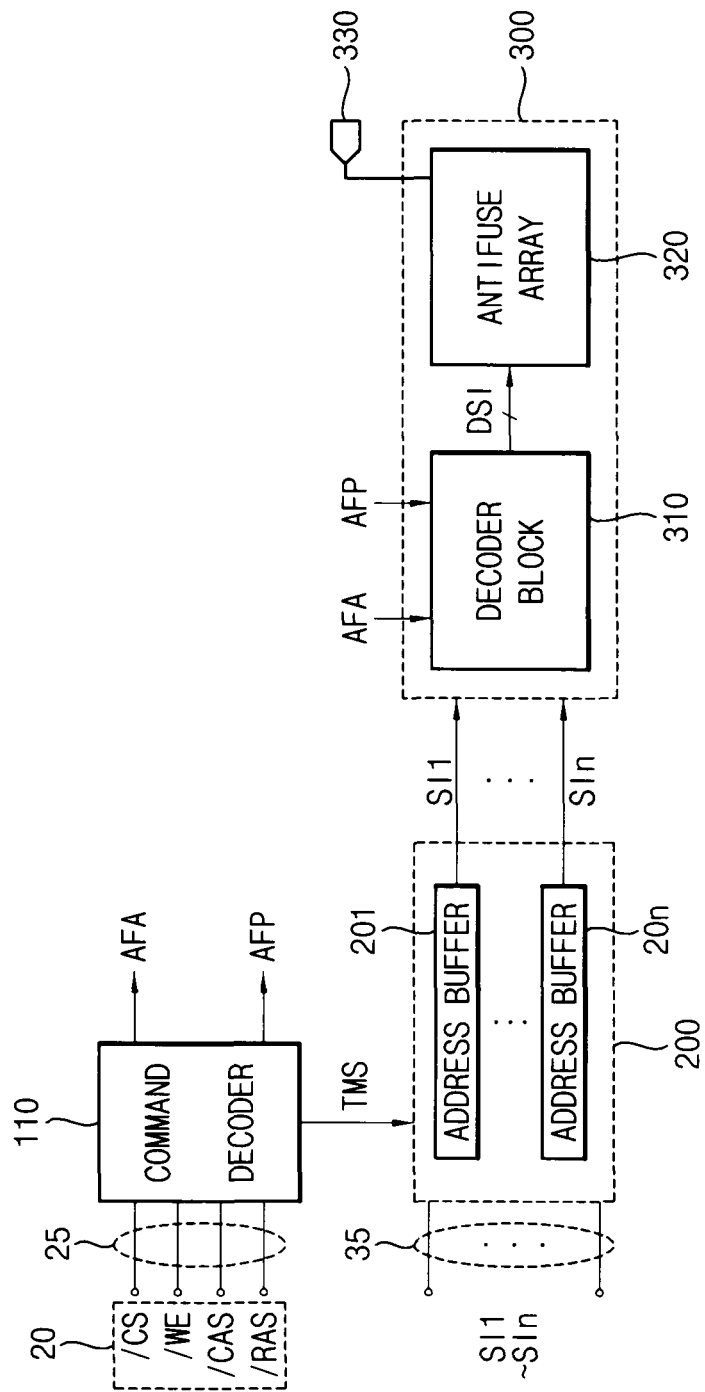
FIG. 8 illustrates that the anti-fuses are selected in the semiconductor memory device of FIG. 5 according to other example embodiments.

FIG. 8 illustrates that the anti-fuses may be selected in the semiconductor memory device of FIG. 5 according to other example embodiments.

In FIG. 8, the selection information SI1~SIn is received through the address pins 35.

Referring to FIG. 8, the address buffer unit 200 includes a plurality of address buffers 201~20n, each connected to each of the address pins 35. The command decoder 110 decodes the command designated by the control signals /CE, /WE, /CAS and /RAS to activate a test mode signal TMS. Each of the address buffers 201~20n is enabled in response to the test mode signal TMS, and each of the selection information SI1~SIn is stored in each of the address buffers 201~20n. In addition, the command decoder 110 decodes the command designated by the control signals /CE, /WE, /CAS and /RAS to generate a decoder enable signal AFA and a decoder disable signal AFP. The decoder block 310 is enabled in response to the decoder enable signal AFA, receives the selection information SI1~SIn stored in each of the address buffers 201~20n, and decode the selection information SI1~SIn to provide the decoded selection information DSI to the anti-fuse array 320 for selecting desired anti-fuses. The program operation or the test operation is performed on the selected anti-fuses under control of the control logic 100. When the selected anti-fuses are programmed, the decoder block 310 is disabled in response to the decoder disable signal AFP.

Figure 9:
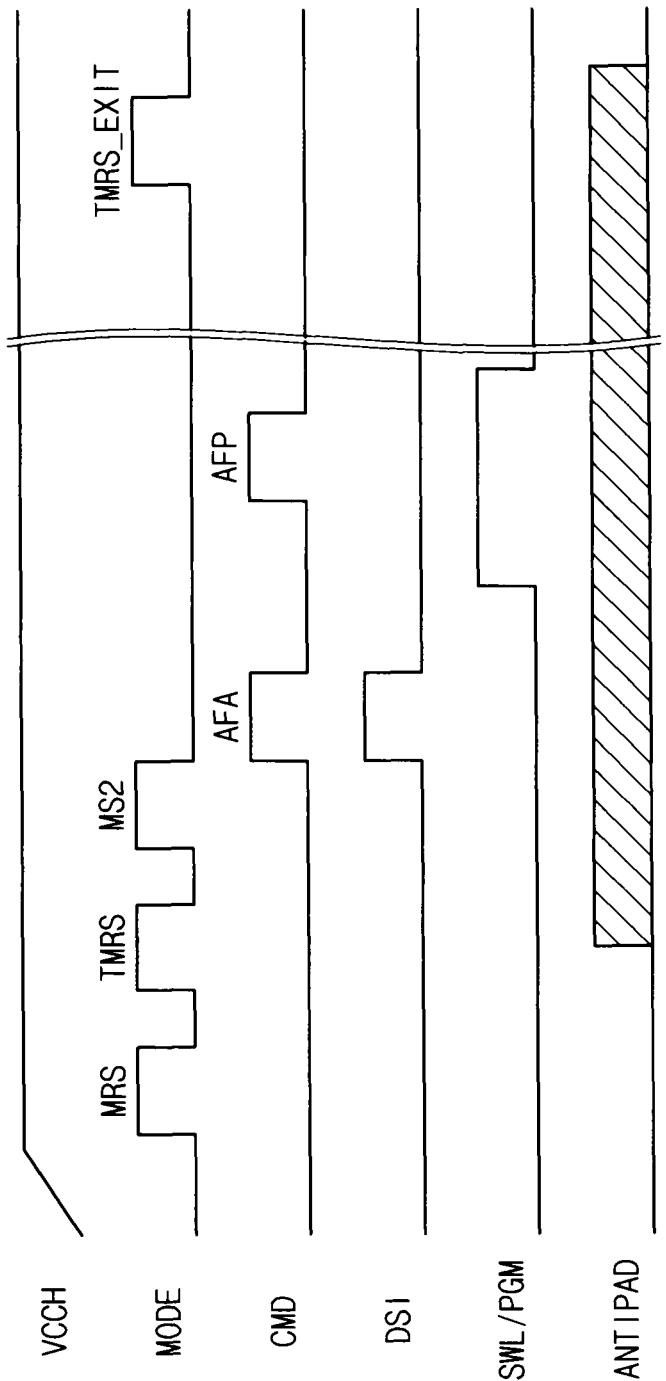
FIG. 9 is an exemplary timing diagram illustrating operation of the semiconductor memory device of FIG. 8.

FIG. 9 is an exemplary timing diagram illustrating an operation of the semiconductor memory device of FIG. 8.

Referring to FIG. 9, after a power supply voltage VCCH is stabilized, the operation mode of the semiconductor device sequentially enters the MRS mode MRS, TMRS mode TMRS and a second operation mode MS2. The second operation mode MS2 designates operation mode in which the anti-fuses are selected using the address pins 35. Since the semiconductor memory device 10 enters the second operation mode MS2, the anti-fuses are selected in the anti-fuse array 320 based on the decoded selection information DSI as described with reference to FIG. 8. Whenever the anti-fuses are selected in the anti-fuse array 320, the decoder enable signal AFA and the decoder disable signal AFP are activated. The selected anti-fuses are programmed in response to a wordline selection signal SWL and a program signal PGM. When the programming of the selected anti-fuses is completed, the operation mode exits from the TMRS mode (e.g. TMRS_EXIT). A high voltage with about 5.5V is applied to an anti-pad 330 which is commonly connected to the anti-fuses during entrance into the TMRS mode TMRS and exit from the TMRS mode TMRS_EXIT.

Figure 10:
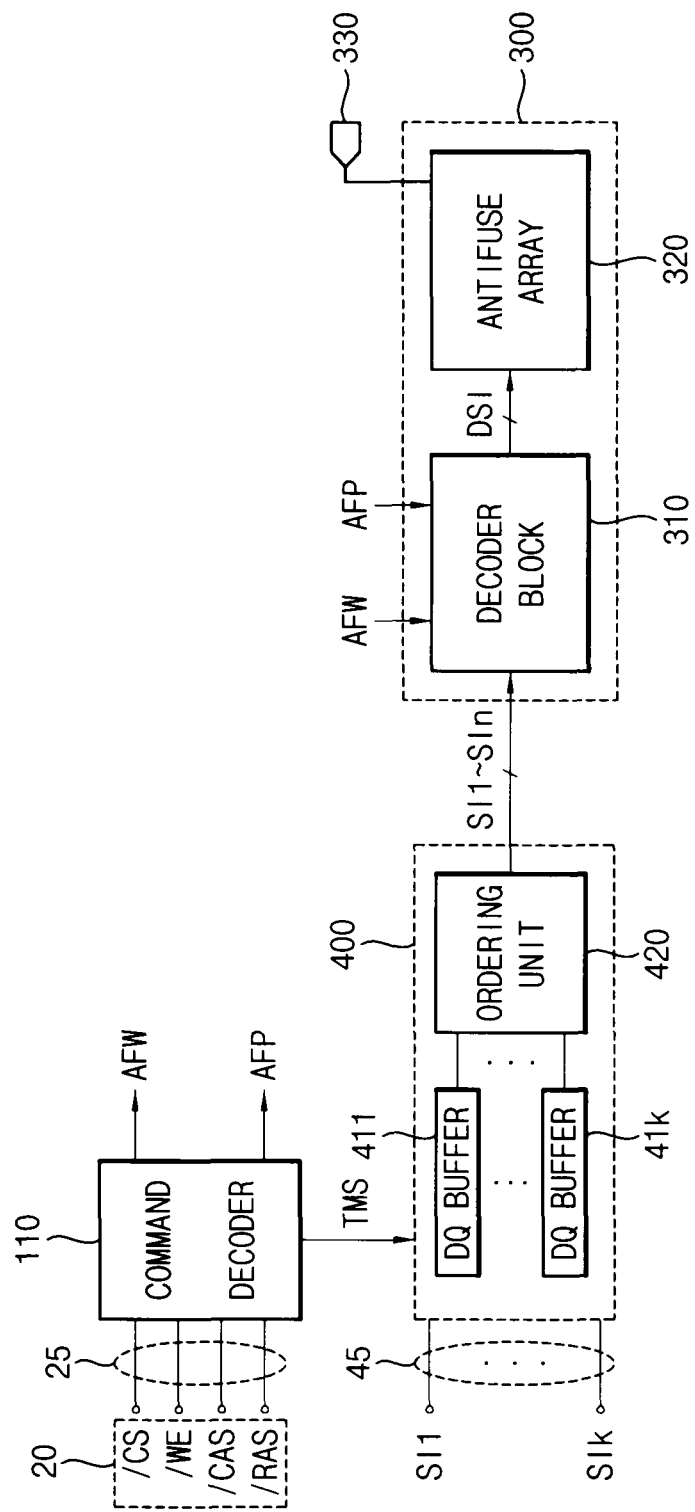
FIG. 10 illustrates that the anti-fuses are selected in the semiconductor memory device of FIG. 5 according to other example embodiments.

FIG. 10 illustrates that the anti-fuses are selected in the semiconductor memory device of FIG. 5 according to other example embodiments.

In FIG. 10, the selection information SI1~SIn is received through the data pins 45 in some embodiments.

Referring to FIG. 10, the I/O circuit 400 includes a plurality of data buffers 411~41k, each connected to each of the data pins 45 and an ordering unit 420 connected to the data buffers 411~41k. The command decoder 110 decodes the command designated by the control signals /CE, /WE, /CAS and /RAS to activate a test mode signal TMS. Each of the data buffers 411~41k is enabled in response to the test mode signal TMS, and each of the selection information SI1~SIk is stored in each of the data buffers 411~41k. Each of selection information SI1~SIk may be stored in each of the data buffers 411~41k in burst mode. The ordering unit 420 orders the selection information SI1~SIk stored in each of the data buffers 411~41k to provide n-bit ordered selection information SI1~SIn to the decoder block 310. In addition, in some embodiments, the command decoder 110 decodes the command designated by the control signals /CE, /WE, /CAS and /RAS to generate a decoder enable signal AFW and a decoder disable signal AFP. The decoder block 310 is enabled in response to the decoder enable signal AFW, receives the ordered selection information SI1~SIn, and decodes the selection information SI1~SIn to provide the decoded selection information DSI to the anti-fuse array 320 for selecting desired anti-fuses. The program operation or the test operation is performed on the selected anti-fuses under control of the control logic 100. When the selected anti-fuses are programmed, the decoder block 310 is disabled in response to the decoder disable signal AFP.

Figure 11:
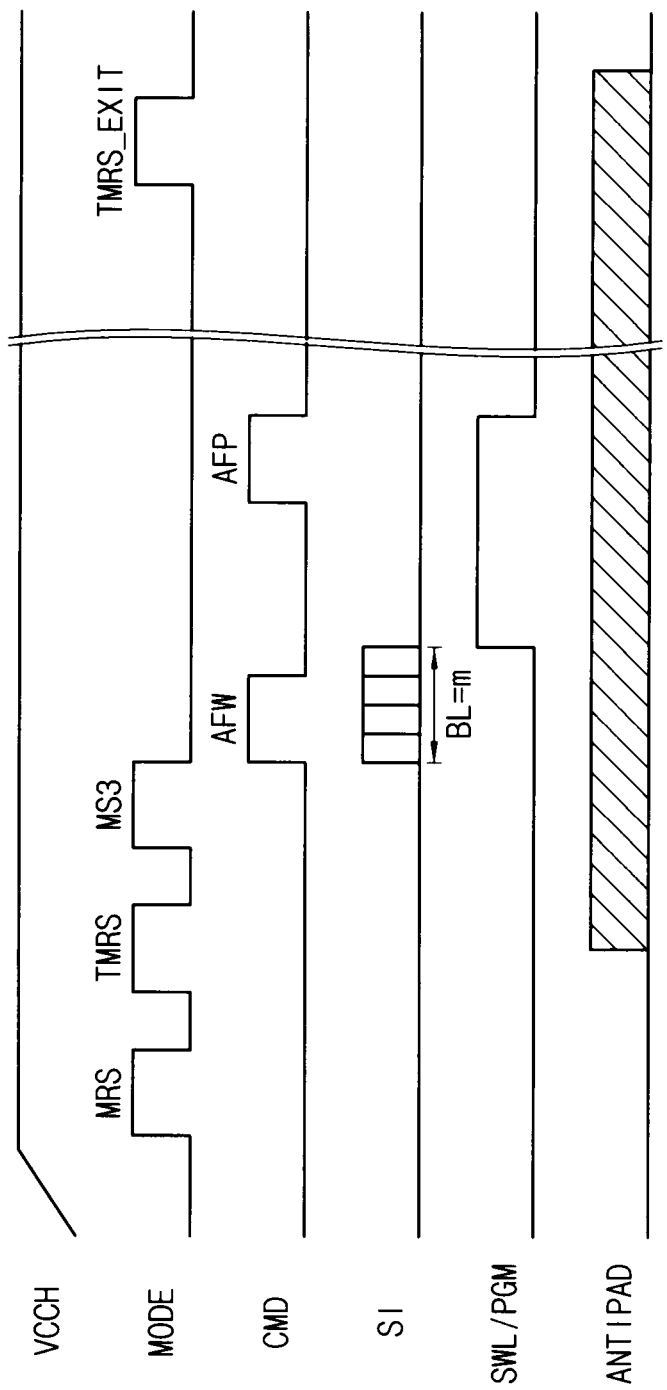
FIG. 11 is an exemplary timing diagram illustrating operation of the semiconductor memory device of FIG. 10.

FIG. 11 is an exemplary timing diagram illustrating an operation of the semiconductor memory device of FIG. 10.

Referring to FIG. 11, after a power supply voltage VCCH is stabilized, the operation mode of the semiconductor device sequentially enters the MRS mode MRS, TMRS mode TMRS and a third operation mode MS3. The third operation mode MS3 designates an operation mode in which the anti-fuses are selected using the data pins 45. Since the semiconductor memory device 10 enters the third operation mode MS3, the selected information SI is received in burst mode with m burst length BL, and the anti-fuses are selected in the anti-fuse array 320 based on the decoded selection information DSI as described with reference to FIG. 10. Whenever the anti-fuses are selected in the anti-fuse array 320, the decoder enable signal AFW and the decoder disable signal AFP are activated. The selected anti-fuses are programmed in response to a wordline selection signal SWL and a program signal PGM. When the programming of the selected anti-fuses is completed, the operation mode exits from the TMRS mode (e.g.

TMRS_EXIT). A high voltage with about 5.5V is applied to an anti-pad 330 which is commonly connected to the anti-fuses during entrance into the TMRS mode TMRS and exit from the TMRS mode TMRS_EXIT.

In some embodiments, when testing semiconductor memory devices, the semiconductor memory devices are tested using one test device. Respective address pins of the semiconductor memory devices and command pins commonly receive signals associated with the test, and respective data pins of the semiconductor memory devices and command pins individually receive test signals for testing respective memory cells of the semiconductor memory devices. Therefore, when the anti-fuses are selected using the data pins as illustrated in FIGS. 10 and 11, intended anti-fuses are simultaneously selected in the respective memory devices using one test device, and the selected anti-fuses are tested or programmed. Therefore, a time required for testing or programming is reduced.

The decoder block 310 decodes the selection information SI as described with reference to FIGS. 1 through 11. In some embodiments, when the test mode signal TMS is activated, the address decoder 130 may receive and decode the selection information SI to provide the decoded selection information DSI to the anti-fuse array 320 and not to the memory cell array 140. In these embodiments, the address decoder 130 may include a switching circuit such as a multiplexer or a switch and may decode the address signal to be provided to the memory cell array 140 in a normal operation mode and/or may decode the selection information SI to be provided to the anti-fuse array 320.

During fabrication of a semiconductor memory device, even when only one of a great number of memory cells is defective, the semiconductor memory device may be rejected as a failed one. Discarding a semiconductor memory device as a failed device due to defects in one or more of the memory cells reduces productivity. A defective memory cell may be replaced with a pre-fabricated redundant cell in order to repair the memory device.

During a repair operation using a redundant cell, a redundant row and a redundant column are pre-fabricated for each memory cell array so that a row or column of memory cells including a defective memory cell may be replaced with the redundant row or redundant column. After a wafer is manufactured and a defective memory cell is detected via a test, an internal circuit may perform a program operation replacing an address of the defective memory cell with an address of a redundant cell. Thus, when an address signal corresponding to a defective line is addressed, the redundant line is accessed instead of the defective line.

A repair operation may be also performed using a fuse. For example, a semiconductor memory device may be repaired at a wafer level. For this reason, after a package assembly is completed, even when the semiconductor memory device turns out to have a defective memory cell, the repair operation may not be able to be performed. In order to overcome this drawback, anti-fuses may be used to repair defects.

An anti-fuse has electrical characteristics opposite to those of a fuse. For example, the anti-fuse is a resistive fuse that has a high resistance of, for example, 100 MΩ before activation using a program operation and has a low resistance of, for example, 100 KΩ or lower after activation. The anti-fuse may be formed of a very thin dielectric material, such as a composite formed by interposing a dielectric material, such as $SiO_2$, silicon nitride, tantalum oxide, or silicon dioxide-silicon nitride-silicon dioxide (ONO), between two conductive materials. During a program operation of an anti-fuse, a high voltage of, for example, about 5.5V, is applied to anti-fuse terminals for a sufficient time to destroy the dielectric material. Thus, when the anti-fuse is programmed, an electrical short occurs between the two conductive materials of the anti-fuse, thereby reducing the resistance of the anti-fuse. Therefore, the anti-fuse is electrically open before a program operation and becomes an electrical short after the program operation.

Figure 12:
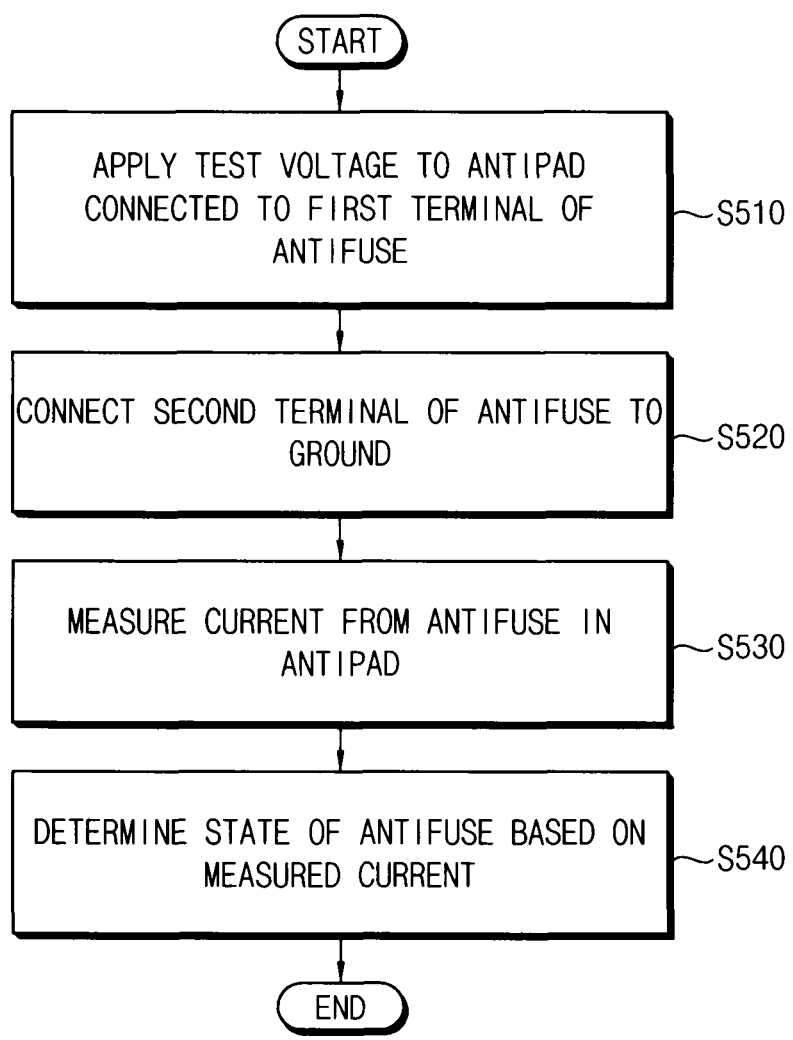
FIG. 12 is a flow chart illustrating a method of monitoring anti-fuses according to some example embodiments.

FIG. 12 is a flow chart illustrating a method of monitoring anti-fuses according to some example embodiments.

Referring to FIG. 12, for monitoring anti-fuses, a test voltage is applied to an anti-pad connected to a first terminal of at least one anti-fuse (S510). The test voltage may have level lower than a program voltage. For example, the test voltage has a level that does not destroy the dielectric material in the anti-fuse but is capable of forming a current path in the dielectric material in the anti-fuse. A second terminal of the at least one anti-fuse is connected to a ground voltage (S520). When the test voltage is applied to the first terminal of the anti-fuse and the second terminal of at least one anti-fuse connected to the ground voltage, a soft breakdown phenomenon occurs in the dielectric material in the anti-fuse and a current flow through the anti-fuse. The current from the anti-fuse is measured in the anti-pad (S530). A state of the anti-fuse is determined based on the measured current (S540). For example, when the test voltage is applied to the anti-fuses, the current from the anti-fuses is measured before program operation and if the current from a specific anti-fuse (or group of anti-fuses) is more then a first reference value, the corresponding anti-fuse (or group of anti-fuses) has an initial defect. Therefore, the corresponding anti-fuse (or group of anti-fuses) having the initial defect may be replaced with normal anti-fuses. In another example, when the test voltage is applied to the anti-fuses, the current from the anti-fuses is measured after program operation and if the current of a specific anti-fuse (or group of anti-fuses) is less than a first reference value, the corresponding anti-fuse (or group of anti-fuses) has not been normally programmed. Therefore, the corresponding anti-fuse (or group of anti-fuses) is reprogrammed. In addition in some embodiments, when the test voltage is applied to the unselected anti-fuses, the current from the anti-fuses is measured and if the current of a specific anti-fuse (or group of anti-fuses) is more than a reference value, the corresponding anti-fuse (or group of anti-fuses) are determined to be affected by the program operation. Therefore, the corresponding anti-fuse (or group of anti-fuses) may be replaced with a normal anti-fuse (or group of respective, normal anti-fuses).

Figure 13:
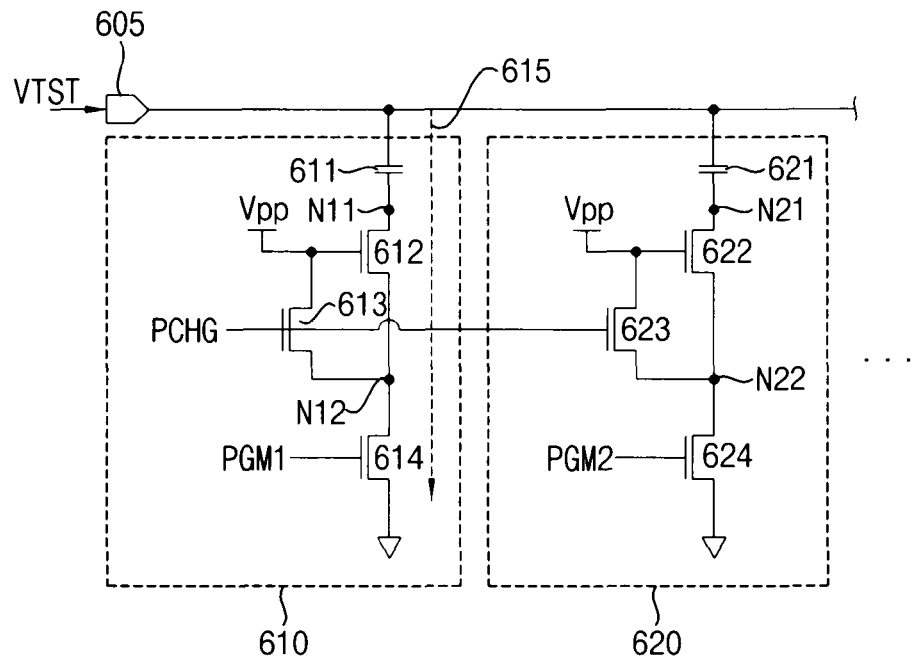
FIG. 13 illustrates that the anti-fuses are monitored according to the method of FIG. 12 according to some example embodiments.

FIG. 13 illustrates that the anti-fuses are monitored according to the method of FIG. 12 according to some example embodiments.

In FIG. 13, the anti-fuses are arranged in non-array structure in some embodiments.

Referring to FIG. 13, an anti-fuse circuit includes anti-fuse cells 610 and 620 connected in parallel to an anti-pad 605. The anti-fuse cell 610 includes an anti-fuse 611 and n-channel metal oxide semiconductor (NMOS) transistors 612~414. The anti-fuse 611 has a first terminal connected to the anti-pad 605. The NMOS transistor 612 is connected to a second terminal of the anti-fuse 611 at a node N11 and the NMOS transistor 612 has a gate receiving a voltage Vpp. The NMOS transistor 612 may be turned-on in response to the voltage Vpp. The NMOS transistor 613 is connected to a gate and source of the NMOS transistor 612 and has a gate receiving a precharge voltage PCHG. The NMOS transistor 614 is connected to the NMOS transistors 612 and 613 at a node N12 and has a gate receiving a program signal PGM1. The NMOS transistor 614 is connected between the node N12 and a ground. The NMOS transistor 613 floats the node N12 in response to the precharge voltage PCHG.

The anti-fuse cell 620 includes an anti-fuse 621 and NMOS transistors 622~624. The anti-fuse 621 has a first terminal connected to the anti-pad 605. The NMOS transistor 622 is connected to a second terminal of the anti-fuse 621 at a node N21 and the NMOS transistor 622 has a gate receiving the voltage Vpp. The NMOS transistor 622 may be turned-on in response to the voltage Vpp. The NMOS transistor 623 is connected to a gate and source of the NMOS transistor 622 and has a gate receiving the precharge voltage PCHG. The NMOS transistor 624 is connected to the NMOS transistors 622 and 623 at a node N22 and has a gate receiving a program signal PGM2. The NMOS transistor 624 is connected between the node N22 and the ground. The NMOS transistor 623 floats the node N22 in response to the precharge voltage PCHG.

When the test voltage VTST whose level is lower than the program voltage is applied to the anti-pad 605 and the program signal PGM1 transitions to high level to turn-on the NMOS transistor 614, a current path 615 is formed from the anti-pad 605 through the anti-fuse 611 to the ground and current flows from the anti-fuse cell 610 to the anti-pad 605. The current from the anti-fuse 611 is measured and the state of the anti-fuse 611 is determined based on the measured current.

Figure 14:
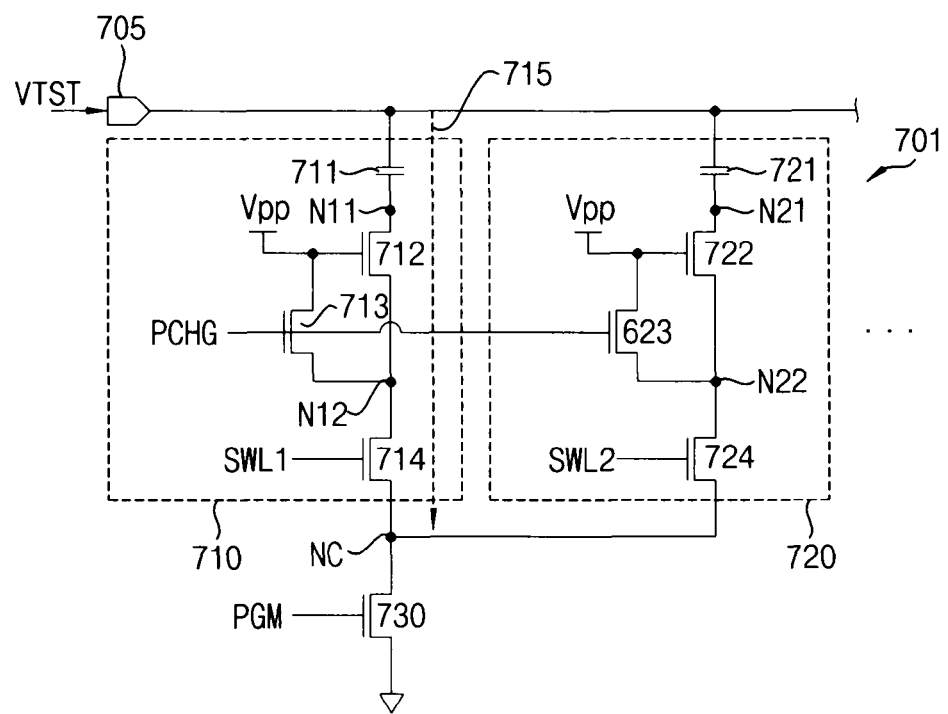
FIG. 14 illustrates that the anti-fuses are monitored according to the method of FIG. 12 according to other example embodiments.

FIG. 14 illustrates that the anti-fuses are monitored according to the method of FIG. 12 according to other example embodiments.

In FIG. 14, the anti-fuses are arranged in array structure in some embodiments.

Referring to FIG. 14, an anti-fuse circuit includes anti-fuse cells 710 and 720 connected in parallel between an anti-pad 705 and NMOS transistor 730. The anti-fuse cell 710 includes an anti-fuse 711 and NMOS transistors 712~714. The anti-fuse 711 has a first terminal connected to the anti-pad 705. The NMOS transistor 712 is connected to a second terminal of the anti-fuse 711 at a node N11 and the NMOS transistor 712 has a gate receiving a voltage Vpp. The NMOS transistor 712 may be turned-on in response to the voltage Vpp. The NMOS transistor 713 is connected to a gate and source of the NMOS transistor 712 and has a gate receiving a precharge voltage PCHG. The NMOS transistor 714 is connected to the NMOS transistors 712 and 713 at a node N12 and has a gate receiving a wordline selection signal SWL1. The NMOS transistor 714 is connected between the node N12 and a node NC. The NMOS transistor 713 floats the node N12 in response to the precharge voltage PCHG. The NMOS transistor 730 is connected between the node NC and the ground and has a gate receiving a program signal PGM.

The anti-fuse cell 720 includes an anti-fuse 721 and NMOS transistors 722~724. The anti-fuse 721 has a first terminal connected to the anti-pad 705. The NMOS transistor 722 is connected to a second terminal of the anti-fuse 721 at a node N21 and the NMOS transistor 722 has a gate receiving the voltage Vpp. The NMOS transistor 722 may be turned-on in response to the voltage Vpp. The NMOS transistor 723 is connected to a gate and source of the NMOS transistor 722 and has a gate receiving the precharge voltage PCHG. The NMOS transistor 724 is connected to the NMOS transistors 722 and 723 at a node N22 and has a gate receiving a wordline selection signal SWL2. The NMOS transistor 724 is connected between the node N22 and the node NC. The NMOS transistor 723 floats the node N22 in response to the precharge voltage PCHG.

When the test voltage VTST whose level is lower than the program voltage is applied to the anti-pad 705, and the wordline selection signal SWL1 and the program signal PGM transition to high level to turn-on the NMOS transistors 714 and 730, a current path 715 is formed from the anti-pad 705 through the anti-fuse 711 to the ground and current flows from the anti-fuse cell 710 to the anti-pad 705. The current from the anti-fuse 711 is measured and the state of the anti-fuse 711 is determined based on the measured current.

Monitoring of the anti-fuses with reference to FIGS. 13 and 14 may be applicable to monitoring of the anti-fuses at a wafer level according to some embodiments.

Figure 15:
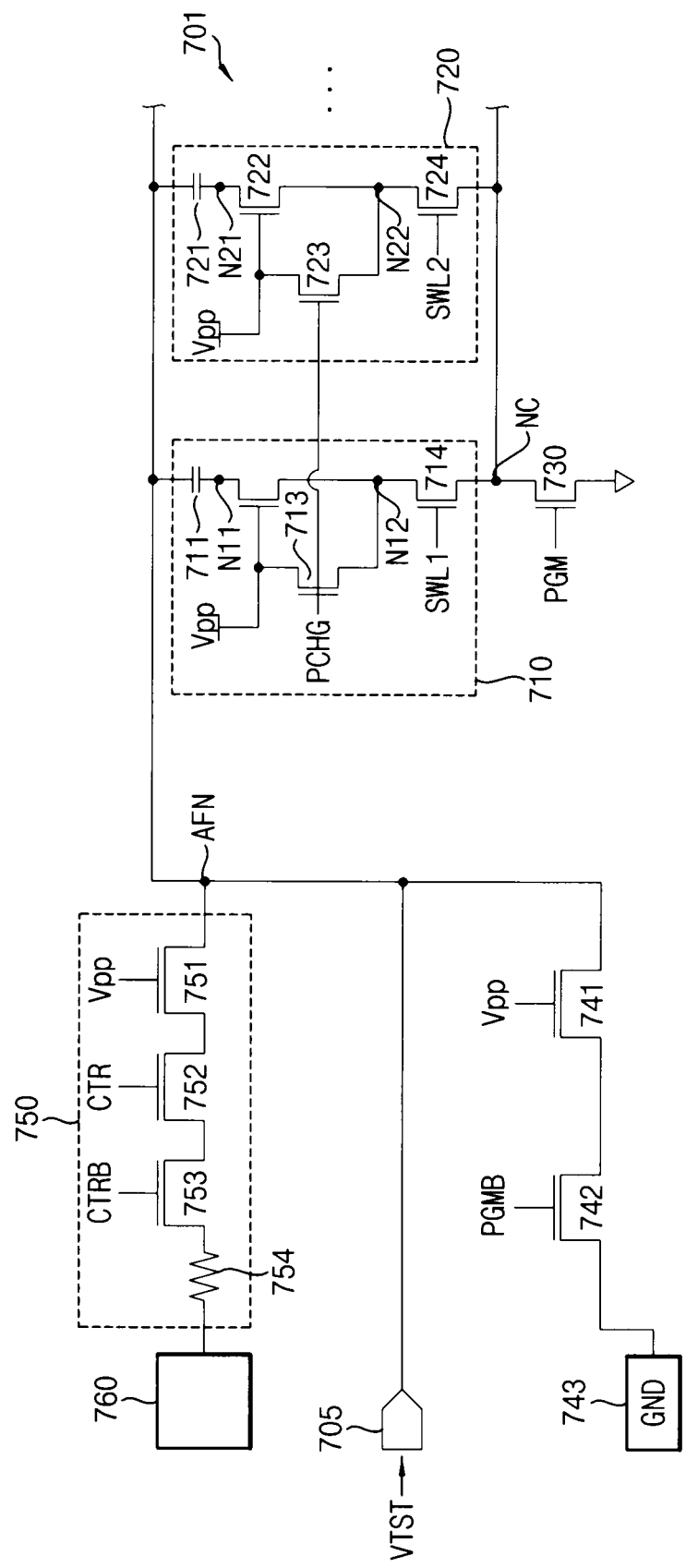
FIG. 15 illustrates that the anti-fuses are monitored according to some example embodiments.

FIG. 15 illustrates that the anti-fuses are monitored according to some example embodiments.

FIG. 15 is different from FIG. 14 in that a current measuring circuit 750 may be connected in parallel with the anti-pad 705 and NMOS transistor 741 and p-channel metal oxide semiconductor (PMOS) transistor 742 may be connected between a ground pad 743 and an anti-pad node AFN in parallel with the anti-pad 705. The current measuring circuit 750 is connected between the anti-pad node AFN and a pin 760 which may be implemented with an address pin or a data mask pin. The current measuring circuit 750 includes NMOS transistors 751 and 725, a PMOS transistor 753 and a resistor 754 connected between the anti-pad node AFN and the pin 760. The NMOS transistor 751 has a gate receiving the voltage Vpp and the NMOS transistor 751 may always be turned-on. The NMOS transistor 752 has a gate receiving a control signal CTR. The PMOS transistor 753 has a gate receiving a control signal CTRB that the control signal CTR is inverted. Therefore, the NMOS transistor 752 and the PMOS transistor 753 may be simultaneously turned-on or turned-off. The NMOS transistor 741 has a gate receiving the voltage Vpp and the NMOS transistor 741 may always be turned-on. The NMOS transistor 742 has a gate receiving an inverted program signal PGMB that the program signal PGM is inverted.

When the test voltage VTST whose level is lower than the program voltage is applied to the anti-pad 705, and the wordline selection signal SWL1 and the program signal PGM transition to high level to turn-on the NMOS transistors 714 and 730, a current path 715 is formed from the anti-pad 705 through the anti-fuse 711 to the ground and current flows from the anti-fuse cell 710 to current measuring circuit 750 as described with reference to FIG. 14. At this time, in some embodiments, the control signal CTR transitions to high level, and current flowing from the resistor 754 connected to the pin 760 is measured. The state of the anti-fuse 711 is determined based on the measured current. When the program signal PGM transitions to high level, the NMOS transistor 742 is turned-on in response to the inverted program signal PGMB and the anti-fuse cell 710 is sensed in the ground pad GND 743.

In one embodiment of a current measuring mode for determining the state of the anti-fuse 711 at a wafer level, the NMOS transistor 752 is turned-off, the PMOS transistor 753 is turned-off, NMOS transistor 742 is turned-off, and the test voltage VTST with about 1.2V is applied to the anti-pad 705. In one embodiment of a program mode for determining the state of the anti-fuse 711 after program operation at a wafer level, the NMOS transistor 752 is turned-off, the PMOS transistor 753 is turned-off, NMOS transistor 742 is turned-on, and the program voltage with about 5.5V is applied to the anti-pad 705.

In one embodiment of a current measuring mode for determining the state of the anti-fuse 711 at a package level, the NMOS transistor 752 is turned-on, the PMOS transistor 753 is turned-on, NMOS transistor 742 is turned-off, and the test voltage VTST with about 1.2V is applied to the anti-pad 705. In one embodiment of a program mode for determining the state of the anti-fuse 711 after program operation at a package level, the NMOS transistor 752 is turned-off, the PMOS transistor 753 is turned-off, NMOS transistor 742 is turned-off and the program voltage with about 5.5V is applied to the anti-pad 705.

In one embodiment of a normal mode for sensing anti-fuse cell 710, the NMOS transistor 752 is turned-off, the PMOS transistor 753 is turned-off, NMOS transistor 742 is turned-on, and the anti-pad 705 is connected to the ground.

The example embodiment of FIG. 15 may be applicable to monitoring of the anti-fuses at a wafer level of a package level. For example, when monitoring the anti-fuses at a package level, current from the anti-fuses may be measured using the current measuring circuit 750 connected to the pin 760 which may be implemented with an address pin or a data mask pin included in a semiconductor memory device package.

Figure 16:
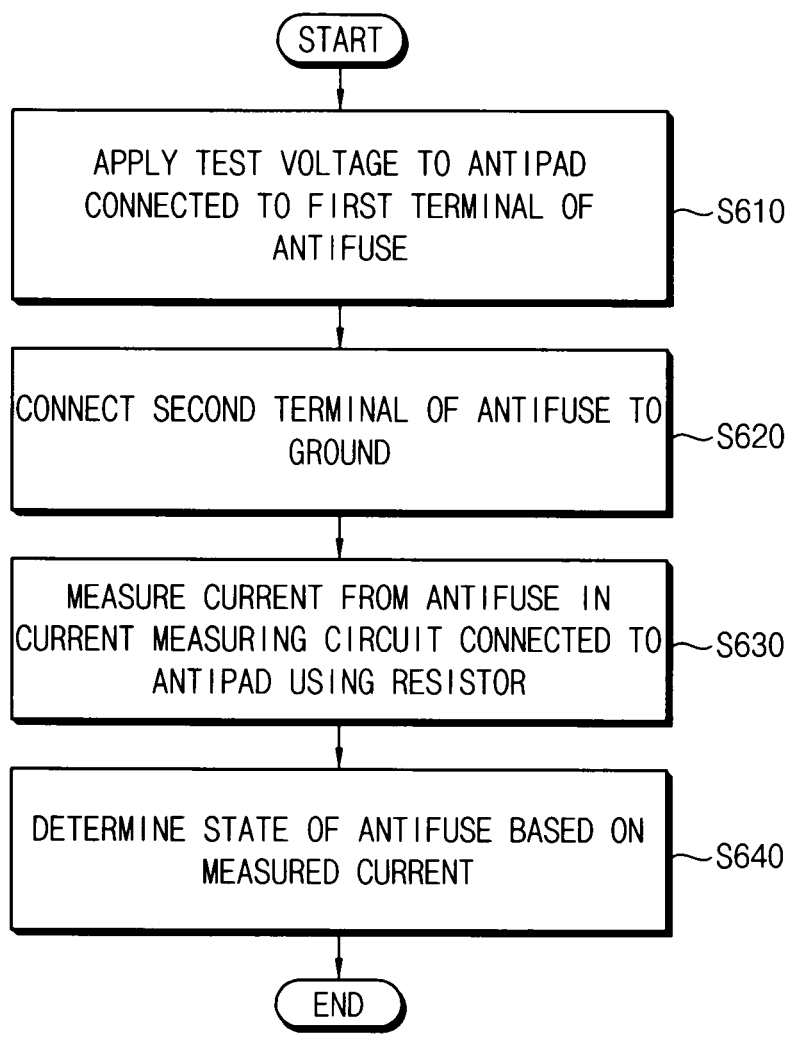
FIG. 16 is a flow chart illustrating a method of monitoring anti-fuses according to other example embodiments.

FIG. 16 is a flow chart illustrating a method of monitoring anti-fuses according to other example embodiments.

Referring to FIGS. 15 and 16, for monitoring the anti-fuses, a test voltage VTST whose level is lower than the program voltage is applied to the anti-pad 705 connected to the first terminal of the anti-fuse 711 (S610). The second terminal of the anti-fuse 711 is connected to the ground voltage (S620). The second terminal of the anti-fuse 711 is connected to the ground voltage by turning-on the NMOS transistors 714 and 730. A current from the anti-fuse 711 is measured in the current measuring circuit 750 which is connected to the anti-fuse cell 710 in parallel with the anti-pad 705 using the resistor 754 connected to the pad 760 (S630). The state of the anti-fuse 711 is determined based on the measured current (S640). When the semiconductor memory device is packaged and the anti-fuses are programmed, anti-fuses having defects may be monitored by using the method of FIG. 16.

Figure 17:
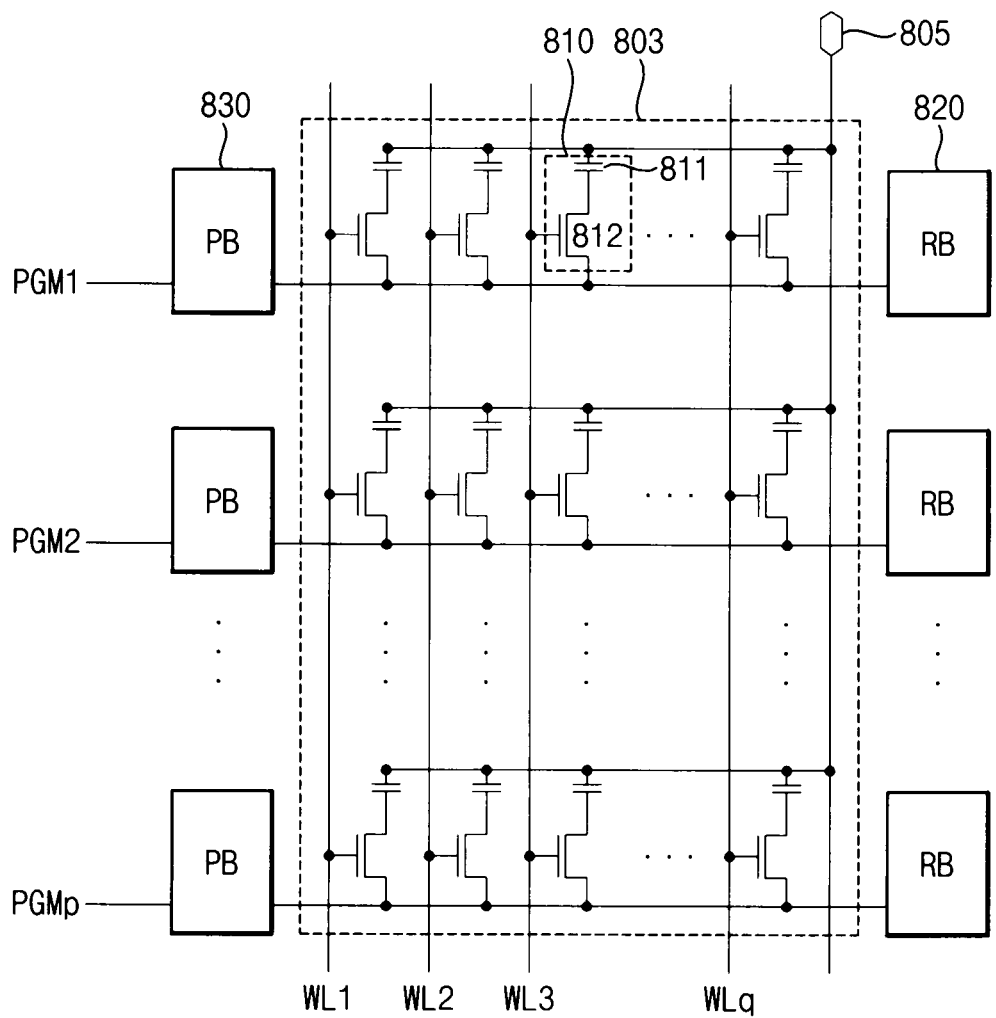
FIG. 17 is a block diagram illustrating an anti-fuse circuit according to some example embodiments.

FIG. 17 is a block diagram illustrating an anti-fuse circuit according to some example embodiments.

Referring to FIG. 17, an anti-fuse circuit 800 includes an anti-fuse array 803, a plurality of program units 830 and a plurality of read units 820. The anti-fuse array 803 includes a plurality of anti-fuse cells 810 arranged in matrix configuration. Each of the program units 830 programs the anti-fuse cells 810 in a column direction in response to each of program signals PGM1~PGMp. Each of the read units 820 senses data in anti-fuse cells 810 in a column direction. Each of the anti-fuse cells 810 includes an anti-fuse 811 and a selection transistor 812. A first terminal of the anti-fuse 811 is connected to an anti-pad 805 and a second terminal of the anti-fuse 811 is connected to a first terminal of the selection transistor 812. A gate of the selection transistor 812 is connected to a corresponding one of wordlines WL1~WL9 and receives wordline selection signal SWLj. A second terminal of the selection transistor 812 is connected to a corresponding program unit 830 and read unit 820 by column unit. Each of the program units 830 may include a NMOS transistor which has a gate receiving corresponding one of the program signals PGM1~PGMp, a drain connected to the second terminal of the selection transistor 812, and a source connected to the ground.

Figure 18:
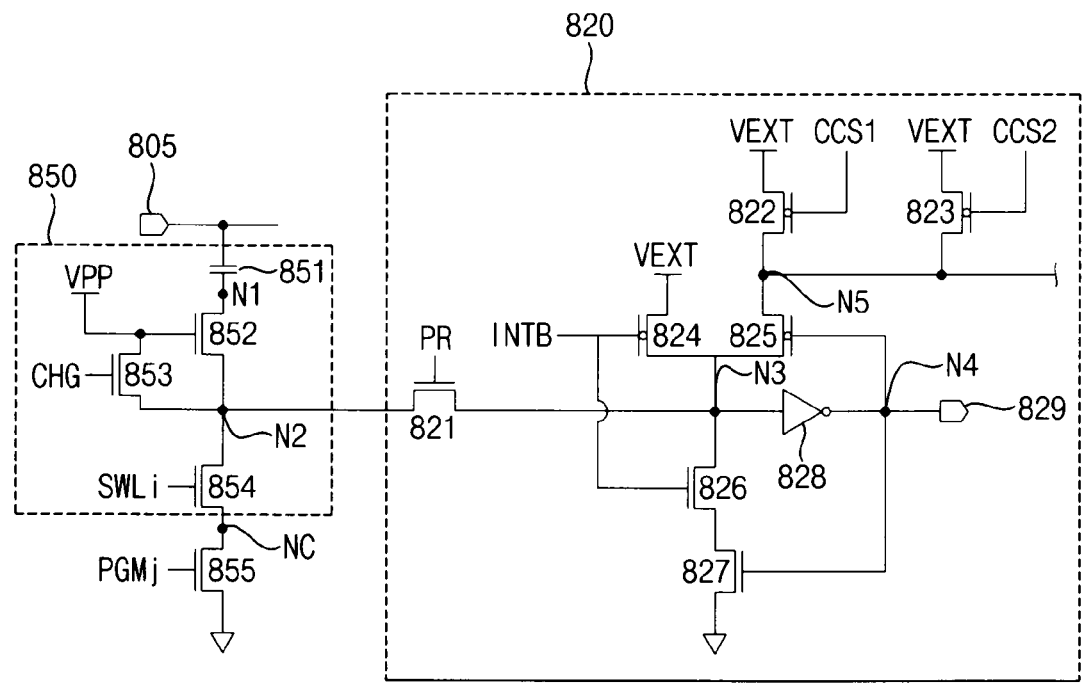
FIG. 18 illustrates an exemplary connection relationship of the anti-fuse cell and the read unit in FIG. 17.

FIG. 18 illustrates an exemplary connection relationship of the anti-fuse cell and the read unit in FIG. 17.

Referring to FIG. 18, an anti-fuse cell 850 includes an anti-fuse 851 and NMOS transistors 852~854. The anti-fuse 851 has a first terminal connected to the anti-pad 805. The NMOS transistor 852 is connected to a second terminal of the anti-fuse 851 at a node N1 and the NMOS transistor 852 has a gate receiving a voltage Vpp. The NMOS transistor 852 may always be turned-on in response to the voltage Vpp. The NMOS transistor 853 is connected to a gate and source of the NMOS transistor 852 and has a gate receiving a precharge voltage PCHG. The NMOS transistor 854 is connected to the NMOS transistors 852 and 853 at a node N2 and has a gate receiving a wordline selection signal SWLi. The NMOS transistor 854 is connected between the node N2 and a node NC. The NMOS transistor 853 floats the node N82 in response to the precharge voltage PCHG. An NMOS transistor 855 is connected between the node NC and the ground and has a gate receiving a program signal PGMj.

The read unit 820 includes a switching transistor 821 connected to the node N2, PMOS transistors 822~825, NMOS transistors 826 and 827, and an inverter 828.

The PMOS transistor 824 is connected between a power supply voltage VEXT and a node N3 and has a gate receiving a power stabilizing signal INTB. The PMOS transistor 822 is connected between the power supply voltage VEXT and a node N5 and has a gate receiving a control signal CCS1. The PMOS transistor 823 is connected between the power supply voltage VEXT and the node N5 and has a gate receiving a control signal CCS2. The PMOS transistor 825 is connected between the nodes N5 and N3. The NMOS transistor 826 is connected between the node N3 and the NMOS transistor 827 and has a gate receiving the power stabilizing signal INTB. The NMOS transistor 827 is connected between the NMOS transistor 826 and the ground. The inverter 828 is connected between the nodes N3 and N4. The node N4 is connected to gates of the PMOS transistor 825 and the NMOS transistor 827 and a data pin 829.

In some embodiments, the switching transistor 821 switches the nodes N2 and N3 in response to power-up signal PR. The power-up signal PR follows the power supply voltage VEXT at an initial stage of power application and maintains the level of the power supply voltage VEXT during a predetermined time when the power supply voltage VEXT is maintained at a regular level. Therefore, when the power supply voltage VEXT is applied, current may flow from the third node N3 to the second node N2 in response to the power-up signal PR.

When the anti-fuse is programmed, high voltage (program voltage) is applied to the anti-pad 805 and when the anti-fuse is not programmed, the ground voltage is applied to the anti-pad 805.

When the anti-fuse 851 is normally programmed, the read unit 820 precharges the node N3 in response to the power stabilizing signal INTB which is low level during the initial stage of power application and transitions to high level when power supply voltage VEXT is maintained at a regular level. Therefore, a current path is formed through the PMOS transistor 824 during the initial stage of power application. The current flows to the second node N2 through the switching transistor 821 because the power-up signal PR follows the power supply voltage VEXT. The current flows to the anti-fuse 851 because the gate of the NMOS transistor 852 is connected to the voltage Vpp.

Since the anti-fuse 851 has a relatively low resistance due to the programming, the voltage level of the node N2 is not raised to a certain level. The voltage level of the node N3 drops according to the voltage level of the node N2 because of the switching transistor 821. When the power supply voltage VEXT is stabilized and the power stabilizing signal INTB transitions to high level, the PMOS transistor 824 is turned-off and the NMOS transistor 826 is turned-on. Since the voltage level of the node N3 drops, the inverter 828 outputs high level, the NMOS transistor 827 is turned-on, and the PMOS transistor 825 is turned-off. Therefore, the node N3 is stabilized with low level. Accordingly, when the anti-fuse 851 is normally programmed, high-level signal is output at the data pin 829.

The PMOS transistors 822 and 823 may adjust current flowing to the node N5 in response to the control signals CCS1 and CCS2 to vary data range sensed by the read unit 820.

In embodiments in which the anti-fuse 851 is not programmed or not normally programmed after program operation, low-level signal is output at the data pin 829.

Therefore, after programming the anti-fuse array 803, each state of the anti-fuses 811 may be determined based on the respective data of the anti-fuses 811 using the read unit 820 as described with reference to FIGS. 17 and 18.

Figure 19:
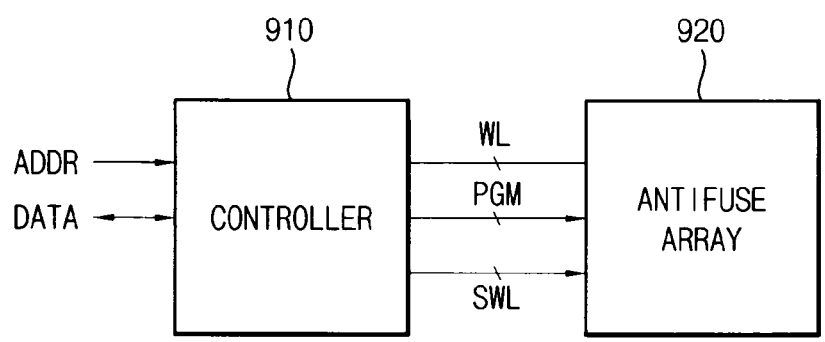
FIG. 19 is a block diagram illustrating a non-volatile memory device according to some example embodiments.

FIG. 19 is a block diagram illustrating a non-volatile memory device according to some example embodiments.

Referring to FIG. 19, a non-volatile memory device 900 includes an anti-fuse array 920 and a controller 910. The anti-fuse array 920 includes a plurality of anti-fuse cells such as the anti-fuse cell 850 in FIG. 18. The anti-fuse array 920 may employ the anti-fuse array 803 in FIG. 17.

The controller 910 is connected to the anti-fuse array 920 through a plurality of wordlines WL. The controller 910 programs the anti-fuse array 920 or reads data from the anti-fuse array 920. For programming the anti-fuse array 920 or reading data from the anti-fuse array 920, the controller receives address ADDR and data DATA and provides program signals PGM and wordline selection signals SWL to the anti-fuse array 920.

The non-volatile memory device 900 may be used as a one time programmable (OTP) memory since the non-volatile memory device 900 uses anti-fuses to store data. For example, the non-volatile memory device 900 may be used as a read only memory (ROM) to store system information in an electronic device. The non-volatile memory device 900 may also be used to store an identification number for copyright management in an integrated circuit (IC).

In addition, in some embodiments, the controller 910 may include the programming unit 830 and the read unit 820 in FIG. 17 and may determine each state of the anti-fuses 811 based on respective data of the anti-fuses 811 after programming the anti-fuse array 920.

Figure 20:
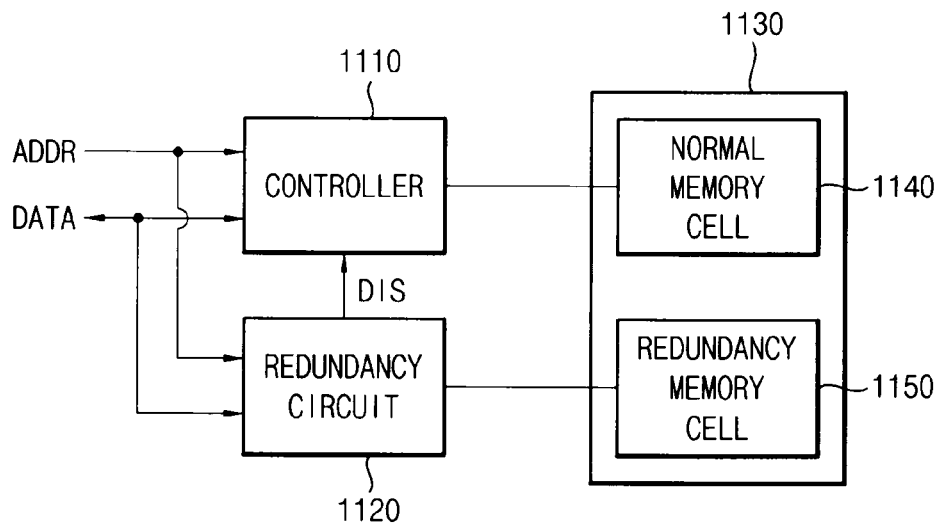
FIG. 20 is a block diagram illustrating a memory device having a repair function according to some example embodiments.

FIG. 20 is a block diagram illustrating a memory device having a repair function according to some example embodiments.

Referring to FIG. 20, a memory device 1100 includes a memory cell array 1130, a controller 1110 and a redundancy circuit 1120 in some embodiments.

The memory cell array 1130 includes normal memory cells 1140 and redundancy memory cells 1150. The redundancy memory cells 1150 may replace failed cells among the normal memory cells 1140.

The controller 1110 writes into the normal memory cells 1140 in response to address ADDR and data DATA or reads from the normal memory cells 1140 to provide a read data DATA to outside in response to the address ADDR.

The redundancy circuit 1120 includes a plurality of anti-fuse cells 810. The redundancy circuit 1120 may store addresses of failed cells among the normal memory cells 1140 into the plurality of anti-fuse cells. The redundancy circuit 1120 determines whether the address ADDR received from outside is the same as the address of the fail cell stored in the plurality of anti-fuse cells. When the address ADDR received from outside is the same as the address of the fail cells stored in the plurality of anti-fuse cells, the redundancy circuit 1120 disables the controller 1110 by providing a disable signal DIS to the controller 1110, and reads from or writes into a redundancy memory cell 1150 corresponding to the failed cell. In addition, in some embodiments, the redundancy circuit 1120 may include the programming unit 830 and the read unit 820 in FIG. 17 and may determine each state of the anti-fuses 811 based on respective data of the anti-fuses 811 after programming the anti-fuse cells.

The controller 1110 may stop operating when the controller 1110 receives the disable signal DIS from the redundancy circuit 1120.

The memory device 1100 may be a dynamic random access memory (DRAM), static random access memory (SRAM), phase change random access memory (PRAM), ferroelectric random access memory (FRAM), resistive random access memory (RRAM), magnetic random access memory (MRAM), etc.

Figure 21:
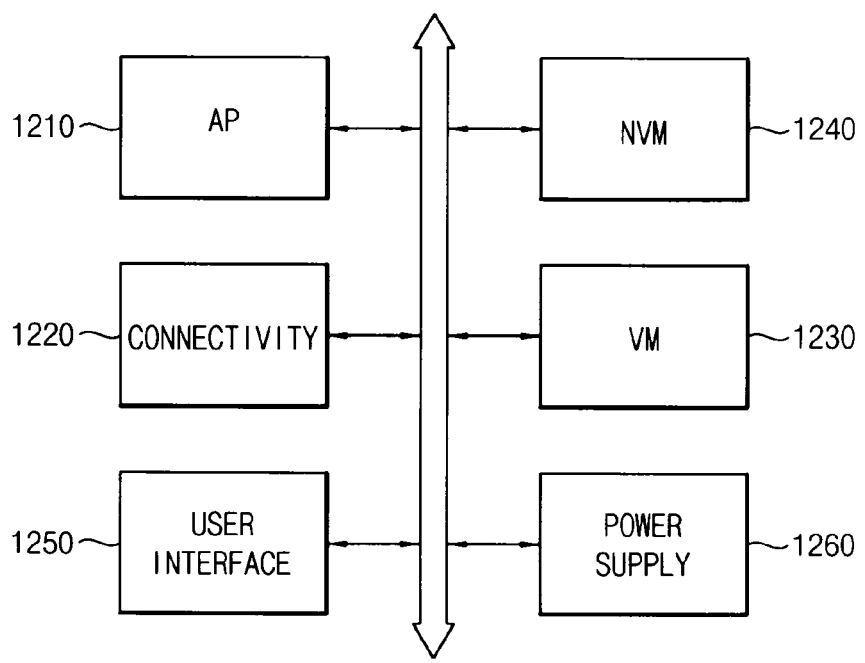
FIG. 21 is a block diagram illustrating a mobile system according to some exemplary embodiments.

FIG. 21 is a block diagram illustrating a mobile system according to some exemplary embodiments.

Referring to FIG. 21, a mobile system 1200 includes an application processor 1210, a connectivity unit 1220, a volatile memory device (VM) 1230, a nonvolatile memory device 1240, a user interface 1250 and a power supply 1260. In some embodiments, the mobile system 1200 may be a mobile phone, a smart phone, a personal digital assistant (PDA), a portable multimedia player (PMP), a digital camera, a music player, a portable game console, a navigation system, etc.

The application processor 1210 may execute applications, such as a web browser, a game application, a video player, etc. In some embodiments, the application processor 1210 may include a single core or multiple cores. For example, the application processor 1210 may be a multi-core processor, such as a dual-core processor, a quad-core processor, a hexa-core processor, etc. The application processor 1210 may include an internal or external cache memory.

The connectivity unit 1220 may perform wired or wireless communication with an external device. For example, the connectivity unit 1220 may perform Ethernet communication, near field communication (NFC), radio frequency identification (RFID) communication, mobile telecommunication, memory card communication, universal serial bus (USB) communication, etc. In some embodiments, connectivity unit 1220 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 1230 may store data processed by the application processor 1210, or may operate as a working memory. For example, the volatile memory device 1230 may be a dynamic random access memory, such as DDR SDRAM, LPDDR SDRAM, GDDR SDRAM, RDRAM, etc., or may be any volatile memory device that requires a refresh operation. The volatile memory device 1230 may include anti-fuses described with reference to FIGS. 1 through 18 and may have decreases programming time and increased yield.

The nonvolatile memory device 1240 may store a boot image for booting the mobile system 1200. For example, the nonvolatile memory device 1240 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

In some embodiments, the mobile system 1200 and/or components of the mobile system 1200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (S SOP), thin small outline package (TSOP), system in package (SIP), multi chip package (MCP), wafer-level fabricated package (WFP), wafer-level processed stack package (WSP), etc.

Figure 22:
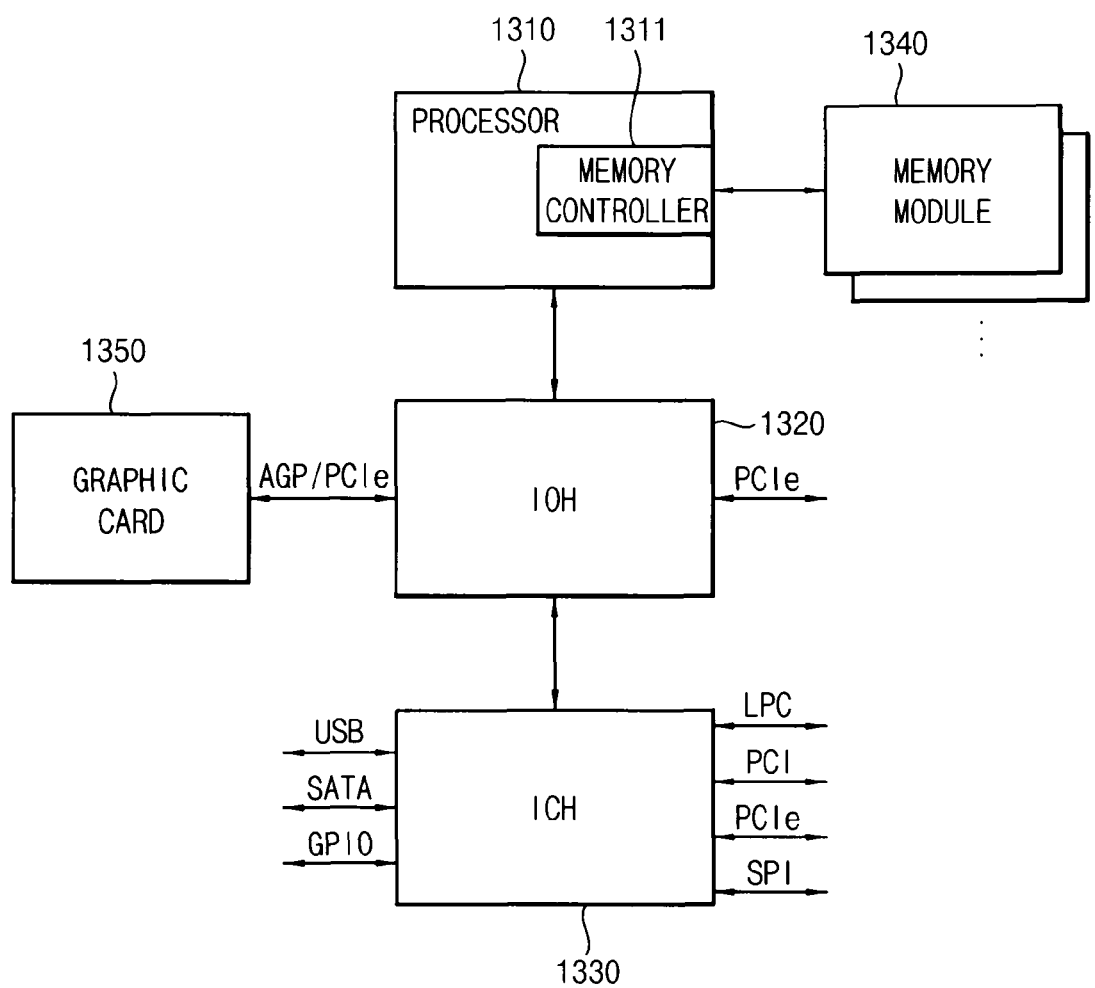
FIG. 22 is a block diagram illustrating a computing system according to some exemplary embodiments.

FIG. 22 is a block diagram illustrating a computing system according to some exemplary embodiments.

Referring to FIG. 22, a computing system 1300 includes a processor 1310, an input/output hub (IOH) 1320, an input/output controller hub (ICH) 1330, at least one memory module 1340 and a graphics card 1350. In some embodiments, the computing system 1300 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1310 may perform various computing functions, such as executing specific software for performing specific calculations or tasks. For example, the processor 1310 may be a microprocessor, a central process unit (CPU), a digital signal processor, or the like. In some embodiments, the processor 1310 may include a single core or multiple cores. For example, the processor 1310 may be a multi-core processor, such as a dual-core processor, a quad-core processor, a hexa-core processor, etc. Although FIG. 40 illustrates the computing system 1300 including one processor 1310, in some embodiments, the computing system 1300 may include a plurality of processors. The processor 1310 may include an internal or external cache memory.

The processor 1310 may include a memory controller 1311 for controlling operations of the memory module 1340. The memory controller 1311 included in the processor 1310 may be referred to as an integrated memory controller (IMC). A memory interface between the memory controller 1311 and the memory module 1340 may be implemented with a single channel including a plurality of signal lines, or may bay be implemented with multiple channels, to each of which at least one memory module 1340 may be coupled. In some embodiments, the memory controller 1311 may be located inside the input/output hub 1320, which may be referred to as memory controller hub (MCH).

The memory module 1340 may include a plurality of volatile memory devices that store data provided from the memory controller 1311. The volatile memory devices may include anti-fuses described with reference to FIGS. 1 through 18 and may have decreased programming time and increased yield.

The input/output hub 1320 may manage data transfer between processor 1310 and devices, such as the graphics card 1350. The input/output hub 1320 may be coupled to the processor 1310 via various interfaces. For example, the interface between the processor 1310 and the input/output hub 1320 may be a front side bus (FSB), a system bus, a Hyper-Transport, a lightning data transport (LDT), a QuickPath interconnect (QPI), a common system interface (CSI), etc. Although FIG. 40 illustrates the computing system 1300 including one input/output hub 1320, in some embodiments, the computing system 1300 may include a plurality of input/output hubs. The input/output hub 1320 may provide various interfaces with the devices. For example, the input/output hub 1320 may provide an accelerated graphics port (AGP) interface, a peripheral component interface-express (PCIe), a communications streaming architecture (CSA) interface, etc.

The graphics card 1350 may be coupled to the input/output hub 1320 via AGP or PCIe. The graphics card 1350 may control a display device (not shown) for displaying an image. The graphics card 1350 may include an internal processor for processing image data and an internal memory device. In some embodiments, the input/output hub 1320 may include an internal graphics device along with or instead of the graphics card 1350 outside the graphics card 1350. The graphics device included in the input/output hub 1320 may be referred to as integrated graphics. Further, the input/output hub 1320 including the internal memory controller and the internal graphics device may be referred to as a graphics and memory controller hub (GMCH).

The input/output controller hub 1330 may perform data buffering and interface arbitration to efficiently operate various system interfaces. The input/output controller hub 1330 may be coupled to the input/output hub 1320 via an internal bus, such as a direct media interface (DMI), a hub interface, an enterprise Southbridge interface (ESI), PCIe, etc. The input/output controller hub 1330 may provide various interfaces with peripheral devices. For example, the input/output controller hub 1330 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1310, the input/output hub 1320 and the input/output controller hub 1330 may be implemented as separate chipsets or separate integrated circuits. In other embodiments, at least two of the processor 1310, the input/output hub 1320 and the input/output controller hub 1330 may be implemented as a single chipset.

As mentioned above, target anti-fuses are programmed or tested by selecting the target anti-fuses using the test mode registers or the address pins or the data pins, and thus the time required for the test or the program may be reduced. In addition, the circuit size may be saved. In addition, states of the anti-fuses are determined at a wafer level or a package level and anti-fuses having defects may be replaced with normal anti-fuses. Therefore, yield may be increased.

Example embodiments may be widely applicable for repairing semiconductor memory devices and semiconductor memory device including anti-fuses.

The above-disclosed subject matter is to be considered illustrative and not restrictive, and the appended claims are intended to cover all such modifications, enhancements, and other embodiments, which fall within the true spirit and scope of the disclosed embodiments. Thus, the invention is to be construed by the broadest permissible interpretation of the following claims and their equivalents, and shall not be restricted or limited by the foregoing detailed description.

What is claimed is:

1. A method of selecting anti-fuses in a semiconductor memory device, the method comprising:
   enabling a decoder block to receive selection information for selecting the anti-fuses;
   decoding the selection information in the decoder block to select at least one of the anti-fuses;
   performing target operation on the selected anti-fuses; and
   disabling the decoder block.

2. The method of claim 1, wherein the selection information is received using a plurality of test mode registers in the semiconductor memory device in a test mode and a command path related to normal operation of the semiconductor memory device is disabled in the test mode.

3. The method of claim 2, wherein receiving the selection information comprises:
 enabling the test mode registers in response to a test mode signal;
 setting the selection information in the test mode registers based on address signal; and
 transmitting the selection information to the decoder block.

4. The method of claim 1, wherein the selection information is received using a plurality of address pins in the semiconductor memory device in a test mode and an address path related to normal operation of the semiconductor memory device is disabled in the test mode.

5. The method of claim 4, wherein receiving the selection information comprises:
 receiving the selection information through the address pins in response to a test mode signal;
 storing the selection information in a plurality of address buffers, each connected to each of the address pins; and
 transmitting the selection information to the decoder block.

6. The method of claim 1, wherein the selection information is received using a plurality of data pins in the semiconductor memory device in a test mode and a data path related to normal operation of the semiconductor memory device is disabled in the test mode.

7. The method of claim 6, wherein receiving the selection information comprises:
 receiving the selection information through the data pins in response to a test mode signal;
 storing the selection information in a plurality of data buffers, each connected to each of the data pins;
 ordering the selection information in an ordering unit connected to the data buffers; and
 transmitting the ordered selection information to the decoder block.

8. The method of claim 7, wherein the selection information is stored in each of the data buffers in a burst mode.

9. The method of claim 1, wherein the target operation corresponds to a test operation or a program operation on the selected anti-fuses.

10. A method of monitoring anti-fuses in a semiconductor memory device, the method comprising:
 applying test voltage to an anti-pad connected to a first terminal of at least one anti-fuse, the test voltage having a level lower than a level of a program voltage;
 connecting a second terminal of the at least one anti-fuse to a ground voltage;
 measuring current from the at least one anti-fuse at the anti-pad; and
 determining state of the at least one anti-fuse based on the measured current.

11. The method of claim 10, wherein the anti-fuses are arranged in a non-array structure.

12. The method of claim 10, wherein the anti-fuses are arranged in an array structure.

13. A method of monitoring anti-fuses in a semiconductor memory device, the method comprising:
 applying test voltage to an anti-pad connected to a first terminal of at least one anti-fuse, the test voltage having a level lower than a level of a program voltage;
 connecting a second terminal of the at least one anti-fuse to a ground voltage;
 measuring a current from the at least one anti-fuse in a current measuring circuit using a resistor, the current measuring circuit being connected to the anti-fuse in parallel with the anti-pad; and
 determining state of the at least one anti-fuse based on the measured current.

14. The method of claim 13, wherein the at least one anti-fuse is monitored at a package level of the semiconductor memory device.

15. The method of claim 13, wherein the resistor is connected to an address pin or a data mask pin of the semiconductor memory device.

* * * * *